(12) United States Patent
Nitta et al.

(10) Patent No.: US 9,773,661 B2
(45) Date of Patent: Sep. 26, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takafumi Nitta, Toyama (JP); Satoshi Shimamoto, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/170,352

(22) Filed: Jun. 1, 2016

(65) Prior Publication Data

US 2016/0358767 A1 Dec. 8, 2016

(30) Foreign Application Priority Data

Jun. 5, 2015 (JP) .................................. 2015-114830

(51) Int. Cl.
*H01L 21/02* (2006.01)
*C23C 16/52* (2006.01)
(Continued)

(52) U.S. Cl.
CPC ........ *H01L 21/0228* (2013.01); *C23C 16/401* (2013.01); *C23C 16/4412* (2013.01); *C23C 16/45527* (2013.01); *C23C 16/45542* (2013.01); *C23C 16/45544* (2013.01); *C23C 16/45557* (2013.01); *C23C 16/509* (2013.01); *C23C 16/52* (2013.01); *H01J 37/32091* (2013.01);
(Continued)

(58) Field of Classification Search
CPC .......... H01L 21/0228; H01L 21/02274; C23C 16/45542; C23C 16/52; C23C 16/509; C23C 16/45544; C23C 16/4412; C23C 16/401; H01J 37/32449; H01J 37/32091; H01J 37/32834; H01J 2237/3321; H01J 2237/3322

See application file for complete search history.

(56) References Cited

U.S. PATENT DOCUMENTS

| 2011/0021033 | A1* | 1/2011 | Ikeuchi ................. C23C 16/402 438/758 |
| 2012/0190215 | A1 | 7/2012 | Ikeuchi et al. |
| 2012/0329286 | A1 | 12/2012 | Takeda et al. |

FOREIGN PATENT DOCUMENTS

| JP | 2011-029284 A | 2/2011 |
| JP | 2012-049506 A | 3/2012 |
| JP | 2013-030752 A | 2/2013 |

* cited by examiner

*Primary Examiner* — Kyoung Lee
(74) *Attorney, Agent, or Firm* — Volpe and Koenig, P.C.

(57) ABSTRACT

There is provided a method of manufacturing a semiconductor device, comprising forming a film on a substrate by performing a cycle a predetermined number of times, the cycle including non-simultaneously performing forming a first layer by supplying a precursor containing hydrogen and an halogen element to the substrate in a process chamber, under a condition in which the precursor is pyrolyzed if the precursor exists alone and under a condition in which a flow rate of the precursor supplied into the process chamber is larger than a flow rate of the precursor exhausted from an interior of the process chamber and forming a second layer by supplying a reactant to the substrate in the process chamber thereby modifying the first layer.

17 Claims, 14 Drawing Sheets

(51) Int. Cl.
*C23C 16/40* (2006.01)
*C23C 16/44* (2006.01)
*C23C 16/455* (2006.01)
*H01J 37/32* (2006.01)
*C23C 16/509* (2006.01)

(52) U.S. Cl.
CPC .. *H01J 37/32449* (2013.01); *H01J 37/32834* (2013.01); *H01L 21/02274* (2013.01); *C23C 16/45578* (2013.01); *H01J 2237/3321* (2013.01); *H01J 2237/3322* (2013.01)

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2015-114830, filed on Jun. 5, 2015, the entire contents of which are incorporated herein by reference.

TECHNICAL FIELD

The present disclosure relates to a method of manufacturing a semiconductor device (apparatus), a substrate processing apparatus, and a recording medium.

BACKGROUND

As an example of processes of manufacturing a semiconductor device, a process of forming a film on a substrate is often carried out by supplying a precursor and a reactant to the substrate accommodated in a process chamber.

SUMMARY

According to one embodiment of the present disclosure, there is provided a technique, including: forming a film on a substrate by performing a cycle a predetermined number of times, the cycle including non-simultaneously performing: forming a first layer by supplying a precursor containing hydrogen and an halogen element to the substrate in a process chamber, under a condition in which the precursor is pyrolyzed if the precursor exists alone and under a condition in which a flow rate of the precursor supplied into the process chamber is larger than a flow rate of the precursor exhausted from an interior of the process chamber; and forming a second layer by supplying a reactant to the substrate in the process chamber thereby modifying the first layer.

DETAILED DESCRIPTION

The present disclosure provides some embodiments of a technique capable of improving a quality of a film formed on a substrate.

One Embodiment of the Present Disclosure

One embodiment of the present disclosure will now be described with reference to FIGS. 1 to 3.

(1) Configuration of Substrate Processing Apparatus

Figure 1:
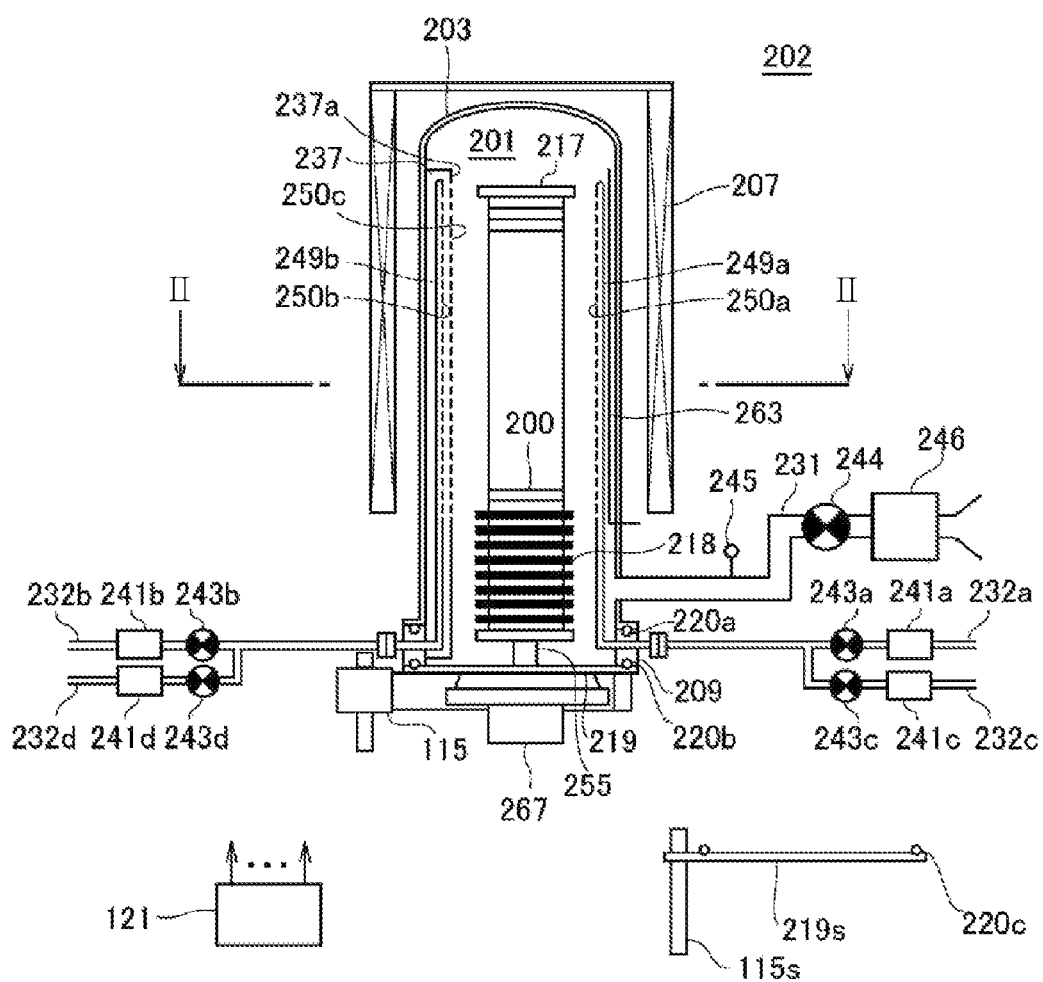
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating mechanism (temperature adjustment part). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 is disposed inside the heater 207 in a concentric relationship with the heater 207. The reaction tube 203 is made of a heat resistant material such as, e.g., quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base. Thus, the reaction tube 203 comes into a vertically mounted state. A processing vessel (reaction vessel) is mainly configured by the reaction tube 203 and the manifold 209. A process chamber 201 is formed in a hollow cylindrical portion of the processing vessel. The process chamber 201 is configured to accommodate a plurality of wafers 200 as substrates. The wafers 200 in a horizontal posture are horizontally stacked at multiple stages along a vertical direction in a boat 217 which will be described later.

Nozzles 249a and 249b are installed in the process chamber 201 so as to penetrate a sidewall of the manifold 209. Gas supply pipes 232a and 232b are respectively connected to the nozzles 249a and 249b. In this way, the two nozzles 249a and 249b and the two gas supply pipes 232a and 232b are installed in the reaction tube 203 and are capable of supplying plural kinds of gases into the process chamber 201.

Mass flow controllers (MFCs) 241a and 241b, which are flow rate controllers (flow rate control parts), and valves 243a and 243b, which are opening/closing valves, are installed in the gas supply pipes 232a and 232b sequentially from the corresponding upstream sides, respectively. Gas supply pipes 232c and 232d, which supply an inert gas, are respectively connected to the gas supply pipes 232a and 232b at the downstream side of the valves 243a and 243b. MFCs 241c and 241d, which are flow rate controllers (flow rate control parts), and valves 243c and 243d, which are opening/closing valves, are installed in the gas supply pipes 232c and 232d sequentially from the corresponding upstream sides, respectively.

The nozzle 249a is connected to a front end portion of the gas supply pipe 232a. As illustrated in FIG. 2, the nozzle 249a is disposed in a space with an annular plan-view shape between the inner wall of the reaction tube 203 and the wafers 200 such that the nozzle 249a extends upward along a stacking direction of the wafers 200 from a lower portion of the inner wall of the reaction tube 203 to an upper portion thereof. Specifically, the nozzle 249a is installed at a lateral side of a wafer arrangement region in which the wafers 200 are arranged, namely in a region which horizontally surrounds the wafer arrangement region, so as to extend along the wafer arrangement region. That is to say, the nozzle 249a is installed in a perpendicular relationship with the surfaces (flat surfaces) of the wafers 200 at a lateral side of the end portions (peripheral edge portions) of the wafers 200 which are carried into the process chamber 201. The nozzle 249a is configured as an L-shaped long nozzle. A horizontal portion of the nozzle 249a is installed to penetrate a sidewall of the manifold 209. A vertical portion of the nozzle 249a is installed to extend upward at least from one end portion of the wafer arrangement region toward the other end portion thereof. Gas supply holes 250a for supplying a gas are formed on the side surface of the nozzle 249a. The gas supply holes 250a are opened toward the center of the reaction tube 203 so as to allow a gas to be supplied toward the wafers 200. The gas supply holes 250a may be formed in a plural number between the lower portion of the reaction tube 203 and the upper portion thereof. The respective gas supply holes 250a may have the same aperture area and may be formed at the same aperture pitch.

The nozzle 249b is connected to a front end portion of the gas supply pipe 232b. The nozzle 249b is installed within a buffer chamber 237 which is a gas diffusion space. The buffer chamber 237 is formed between the inner wall of the reaction tube 203 and a partition wall 237a. as illustrated in FIG. 2, the buffer chamber 237 (the partition wall 237a) is installed in a space with an annular plan-view shape between the inner wall of the reaction tube 203 and the wafers 200 such that the buffer chamber 237 (the partition wall 237a) extends along the stacking direction of the wafers 200 from the lower portion of the inner wall of the reaction tube 203 to the upper portion thereof. That is to say, the buffer chamber 237 (the partition wall 237a) is installed at the lateral side of the wafer arrangement region, namely in the region which horizontally surrounds the wafer arrangement region, so as to extend along the wafer arrangement region. Gas supply holes 250c for supplying a gas are formed in an end portion of the surface of the partition wall 237a which faces (adjoins) the wafers 200. The gas supply holes 250c are opened toward the center of the reaction tube 203 so as to allow a gas to be supplied toward the wafers 200. The gas supply holes 250c may be formed in a plural number between the lower portion of the reaction tube 203 and the upper portion thereof. The respective gas supply holes 250c may have the same aperture area and may be formed at the same aperture pitch.

The nozzle 249b is installed in an end portion of the buffer chamber 237 opposite to the end portion of the buffer chamber 237 having the gas supply holes 250c such that the nozzle 249b extends upward along the stacking direction of the wafers 200 from the lower portion of the inner wall of the reaction tube 203 to the upper portion thereof. Specifically, the nozzle 249b is installed at the lateral side of the wafer arrangement region in which the wafers 200 are arranged, namely in the region which horizontally surrounds the wafer arrangement region, so as to extend along the wafer arrangement region. That is to say, the nozzle 249b is installed in a perpendicular relationship with the surfaces of the wafers 200 at the lateral side of the end portions of the wafers 200 which are carried into the process chamber 201. The nozzle 249b is configured as an L-shaped long nozzle. A horizontal portion of the nozzle 249b is installed to penetrate the sidewall of the manifold 209. A vertical portion of the nozzle 249b is installed to extend upward at least from one end portion of the wafer arrangement region toward the other end portion thereof. Gas supply holes 250b for supplying a gas are formed on the side surface of the nozzle 249b. The gas supply holes 250b are opened toward the center of the buffer chamber 237. Similar to the gas supply holes 250c, the gas supply holes 250b may be formed in a plural number between the lower portion of the reaction tube 203 and the upper portion thereof. In the case where the differential pressure between the interior of the buffer chamber 237 and the interior of the process chamber 201 is small, the aperture area and the aperture pitch of the gas supply holes 250b may be respectively set to remain constant between the upstream side (lower portion) and the downstream side (upper portion) of the nozzle 249b. In the case where the differential pressure between the interior of the buffer chamber 237 and the interior of the process chamber 201 is large, the aperture area of the gas supply holes 250b may be set to become gradually larger from the upstream side toward the downstream side of the nozzle 249b, or the aperture pitch of the gas supply holes 250b may be set to become gradually smaller from the upstream side toward the downstream side of the nozzle 249b.

By adjusting the aperture area or the aperture pitch of the respective gas supply holes 250b between the upstream side and the downstream side as mentioned above, it is possible to inject a gas from the gas supply holes 250b at different flow velocities but at a substantially equal flow rate. The gas injected from the respective gas supply holes 250b is first introduced into the buffer chamber 237. This makes it possible to equalize the flow velocities of the gas within the buffer chamber 237. The gas injected from the respective gas supply holes 250b into the buffer chamber 237 is injected from the gas supply holes 250c into the process chamber 201 after the particle velocity thereof is relaxed within the buffer chamber 237. The gas injected from the respective gas supply holes 250b into the buffer chamber 237 has a uniform flow rate and a uniform flow velocity when injected from the respective gas supply holes 250c into the process chamber 201.

As described above, in the present embodiment, a gas is transferred through the nozzles 249a and 249b and the buffer chamber 237, which are disposed in a vertically-elongated space with an annular plan-view shape, i.e., a cylindrical space, defined by the inner surface of the side wall of the reaction tube 203 and the end portions (peripheral edge portions) of the wafers 200 arranged within the reaction tube 203. The gas is initially injected into the reaction tube 203, near the wafers 200, through the gas supply holes 250a to 250c formed in the nozzles 249a and 249b and the buffer chamber 237, respectively. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve uniformity in the thickness of a film formed on each of the wafers 200. In addition, the gas flowing on the surfaces of the wafers 200, i.e., the residual gas after reaction, flows toward an exhaust port, i.e., the exhaust pipe 231 which will be described later. The flow direction of the residual gas is not limited to a vertical direction but may be appropriately decided depending on a position of the exhaust port.

A precursor, for example, a halosilane precursor gas (hydrogenated halosilane precursor gas) containing silicon (Si), hydrogen (H) and a halogen element, is supplied from the gas supply pipe 232a into the process chamber 201 via the MFC 241a, the valve 243a and the nozzle 249a.

The precursor gas refers to a gaseous precursor, for example, a gas obtained by vaporizing a precursor which remains in a liquid state under room temperature and atmospheric pressure, or a precursor which remains in a gas state under room temperature and atmospheric pressure. When the term "precursor" is used herein, it may refer to "a liquid precursor staying in a liquid state," "a precursor gas staying in a gaseous state," or both.

Furthermore, the halosilane precursor refers to a silane precursor having a halogen element such as chlorine (Cl), fluorine (F), bromine (Br), iodine (I) or the like. That is to say, the halosilane precursor refers to a silane precursor having a halogen group such as a chloro group, a fluoro group, a bromo group, an iodine group or the like. The halosilane precursor may be said to be one kind of halide. The halosilane precursor further containing H is said to be a hydrogenated halosilane precursor.

As the halosilane precursor gas, it may be possible to use, for example, a precursor gas containing Si, H and Cl, namely a chlorosilane precursor gas (hydrogenated chlorosilane precursor gas) represented by a composition formula, $Si_xH_yCl_z$ (where each of x, y and z is an integer of 1 or more). As the hydrogenated chlorosilane precursor gas, it may be possible to use a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, or the like. This gas may be referred to as a precursor gas containing Si, H and Cl and having a Si—H bond and a Si—Cl bond. This gas acts as a Si source.

A gas differing in chemical structure (molecular structure) from the precursor, for example, an H-free Cl-containing gas or a Cl-free H-containing gas, is supplied from the gas supply pipe 232a into the process chamber 201 via the MFC 241a, the valve 243a and the nozzle 249a. As the H-free Cl-containing gas, it may be possible to use, for example, a chlorine ($Cl_2$) gas. As the Cl-free H-containing gas, it may be possible to use, for example, a hydrogen ($H_2$) gas or a monosilane ($SiH_4$) gas. This gas may be included in the precursor gas in the case where this gas is supplied into the process chamber 201 together with the aforementioned precursor gas.

A reactant differing in chemical structure (molecular structure) from the precursor, for example, an oxygen (O)-containing gas, is supplied from the gas supply pipe 232b into the process chamber 201 via the MFC 241b, the valve 243b, the nozzle 249b and the buffer chamber 237.

The O-containing gas acts as an oxidant (oxidizing gas), namely an O source. For the reasons to be described later, an H-free (hydrogen-free) gas may be used as the O-containing gas. For example, an ozone ($O_3$) gas or an oxygen ($O_2$) gas may be appropriately used. In the case where the $O_2$ gas is used as the oxidant, for example, the $O_2$ gas is plasma-excited using a plasma source to be described later and is supplied as a plasma-excited gas ($O_2$* gas). This makes it possible to increase the oxidizing power.

A reactant differing in chemical structure from the precursor, for example, a nitrogen (N)-containing gas, is supplied from the gas supply pipe 232b into the process chamber 201 via the MFC 241b, the valve 243b, the nozzle 249b and the buffer chamber 237.

The N-containing gas acts as a nitriding agent (nitriding gas), namely an N source. As the N-containing gas, it may be possible to use, for example, an ammonia ($NH_3$) gas. In the case where the $NH_3$ gas is used as the nitriding agent, for example, the $NH_3$ gas is plasma-excited using a plasma source to be described later and is supplied as a plasma-excited gas ($NH_3$* gas). This makes it possible to increase the nitriding power.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b, the nozzles 249a and 249b, and the buffer chamber 237.

In the case where the aforementioned precursor is supplied from the gas supply pipe 232a, a precursor supply system as a first supply system is mainly configured by the gas supply pipe 232a, the MFC 241a and the valve 243a. The nozzle 249a may be included in the precursor supply system. The precursor supply system may be referred to as a precursor gas supply system. In the case where the halosilane precursor is supplied from the gas supply pipe 232a, the precursor supply system may be referred to as a halosilane precursor supply system or a halosilane precursor gas supply system.

Furthermore, in the case where the aforementioned reactant is supplied from the gas supply pipe 232b, a reactant supply system as a second supply system is mainly configured by the gas supply pipe 232b, the MFC 241b and the valve 243b. The nozzle 249b and the buffer chamber 237 may be included in the reactant supply system. The reactant supply system may be referred to as a reaction gas supply system. In the case where the oxidant is supplied from the gas supply pipe 232b, the reactant supply system may be referred to as an oxidant supply system, an oxidizing gas supply system or an O-containing gas supply system. In the case where the nitriding agent is supplied from the gas supply pipe 232b, the reactant supply system may be referred to as a nitriding agent supply system, a nitriding gas supply system or an N-containing gas supply system.

Furthermore, an inert gas supply system is mainly configured by the gas supply pipes 232c and 232d, the MFCs 241c and 241d, and the valves 243c and 243d.

Figure 2:
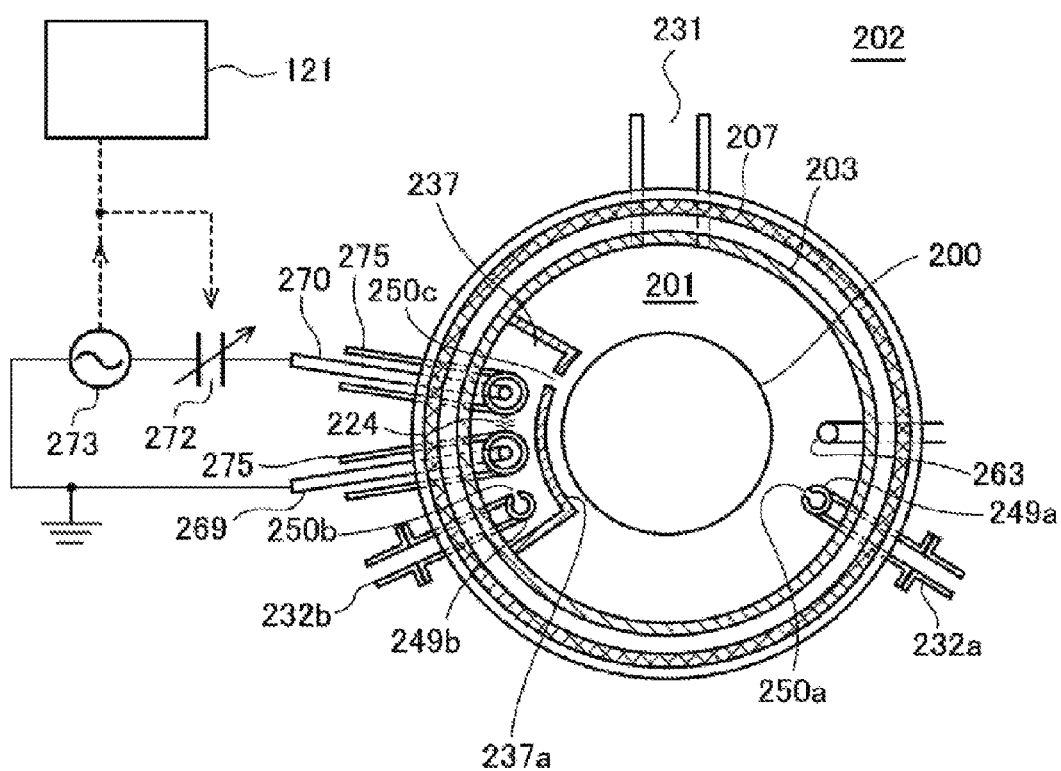
FIG. 2 is a schematic configuration view of the vertical processing furnace of the substrate processing apparatus suitably used in one embodiment of the present disclosure, in which a portion of the processing furnace is shown in a cross section taken along line II-II in FIG. 1.

As illustrated in FIG. 2, two rod-shaped electrodes 269 and 270 made of a conductive material and having an elongated structure are disposed within the buffer chamber 237 so as to extend along the arrangement direction of the wafers 200 from the lower portion of the reaction tube 203 to the upper portion thereof. The respective rod-shaped electrodes 269 and 270 are installed parallel to the nozzle 249b. Each of the respective rod-shaped electrodes 269 and 270 is covered with and protected by an electrode protection tube 275 from the lower portion to the upper portion thereof. One of the rod-shaped electrodes 269 and 270 is connected to a high-frequency power source 273 via a matcher 272 and the other is connected to ground which is a reference potential. By applying high-frequency (RF) power from the high-frequency power source 273 between the rod-shaped electrodes 269 and 270, plasma is generated in a plasma generation region 224 between the rod-shaped electrodes 269 and 270. A plasma source as a plasma generator (plasma generation part) is mainly configured by the rod-shaped electrodes 269 and 270 and the electrode protection tubes 275. The matcher 272 and the high-frequency power source 273 may be included in the plasma source. As will be described later, the plasma source functions as a plasma excitation part (activation mechanism) for plasma-exciting a gas, namely exciting (or activating) a gas in a plasma state.

The electrode protection tubes 275 have a structure that enables the respective rod-shaped electrodes 269 and 270 to be inserted into the buffer chamber 237 in a state in which the rod-shaped electrodes 269 and 270 are isolated from the internal atmosphere of the buffer chamber 237. If an O concentration within the electrode protection tubes 275 is substantially equal to an O concentration in the ambient air, the rod-shaped electrodes 269 and 270 respectively inserted into the electrode protection tubes 275 may be oxidized by the heat generated from the heater 207. By filling an inert gas such as an $N_2$ gas or the like into the electrode protection tubes 275, or by purging the interior of the electrode protection tubes 275 with an inert gas such as an $N_2$ gas or the like through the use of an inert gas purge mechanism, it is possible to reduce the O concentration within the electrode protection tubes 275 and to prevent the oxidization of the rod-shaped electrodes 269 and 270.

An exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as an exhaust valve (pressure regulation part). The APC valve 244 is a valve configured so that the vacuum exhaust of the interior of the process chamber 201 and the vacuum exhaust stop can be performed by opening and closing the valve while operating the vacuum pump 246 and so that the internal pressure of the process chamber 201 can be adjusted by adjusting the opening degree of the valve while operating the vacuum pump 246. The "actual internal pressure" of the process chamber 201 can be brought close to a predetermined "set pressure" by adjusting the opening degree of the APC valve 244 based on the pressure information detected by the pressure sensor 245, while operating the vacuum pump 246. The "set pressure" of the interior of the process chamber 201 may be considered to be synonymous with a "target pressure" used when controlling the internal pressure of the process chamber 201. The "actual internal pressure" of the process chamber 201 follows the value of the set pressure. An exhaust system is mainly configured by the exhaust pipe 231, the APC valve 244 and the pressure sensor 245. The vacuum pump 246 may be included in the exhaust system. The exhaust pipe 231 is not limited to being installed in the reaction tube 203 but may be installed in the manifold 209 just like the nozzles 249a and 249b.

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. Furthermore, a shutter 219s as a furnace opening cover capable of hermetically sealing the lower end opening of the manifold 209 while moving the seal cap 219 down with the boat elevator 115 is installed under the manifold 209. The shutter 219s is made of metal such as, e.g., stainless steel (SUS) or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages. With this configuration, it is hard for heat generated from the heater 207 to be transferred to the seal cap 219. However, the present embodiment is not limited to this configuration. For example, instead of installing the heat insulating plates 218 below the boat 217, a heat insulating tube as a tubular member made of a heat resistant material such as quartz or SiC may be installed below the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is formed in an L-shape. The temperature sensor 263 is installed along the inner wall of the reaction tube 203.

Figure 3:
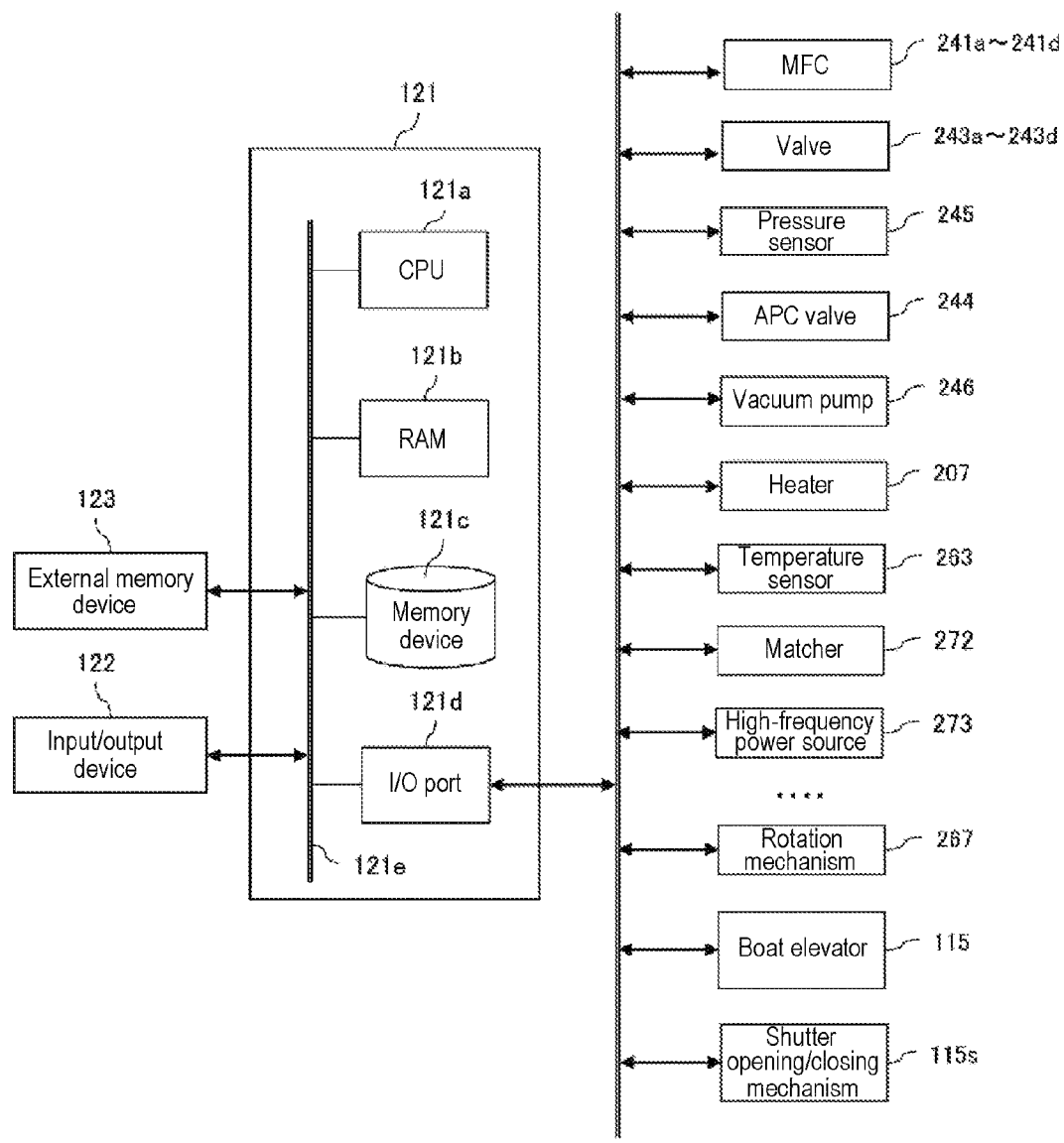
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling operations of a substrate processing apparatus, or a process recipe, in which sequences and conditions of a film forming process to be described later are written, are readably stored in the memory device 121c. The process recipe functions as a program for causing the controller 121 to execute each sequence in the film forming process, which will be described later, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. In addition, the RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s, the matcher 272, the high-frequency power source 273, and the like.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, the impedance adjustment operation using the matcher 272, the power supply operation of the high-frequency power source 273, and the like.

The controller 121 may be configured by installing, on the computer, the aforementioned program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Substrate Processing

A sequence example of forming a film on a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 121.

Figure 4:
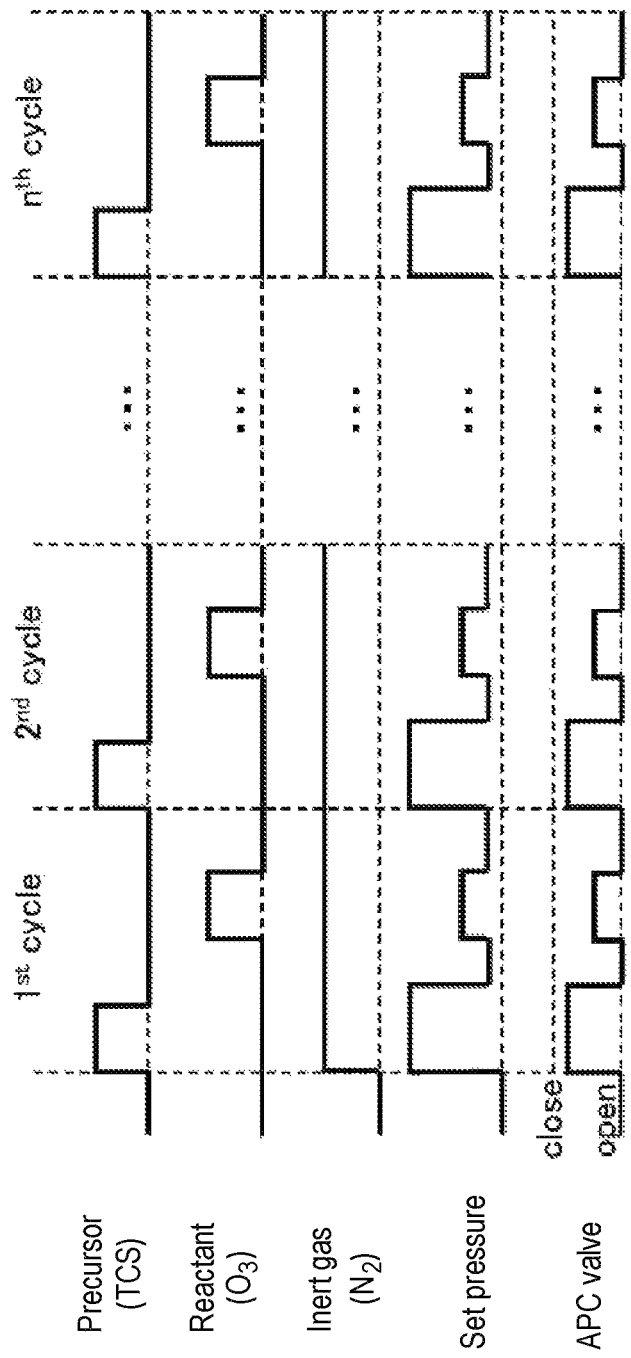
FIG. 4 is a diagram illustrating a film forming sequence according to one embodiment of the present disclosure.

In the film forming sequence illustrated in FIG. 4, a silicon oxide film (SiO film) is formed on the wafer 200 by non-simultaneously performing, a predetermined number of times (n times): a step of forming a silicon layer (Si layer) as a first layer by supplying a TCS gas as a precursor containing H and Cl to the wafer 200 as a substrate in the process chamber 201, under a condition in which TCS is pyrolyzed if TCS exists alone and under a condition in which a flow rate of the TCS gas supplied into the process chamber 201 is larger than a flow rate of the TCS gas exhausted from the interior of the process chamber 201; and a step of forming a silicon oxide layer (SiO layer) as a second layer by supplying an $O_3$ gas as a reactant to the wafer 200 in the process chamber 201 and modifying the first layer.

In the present disclosure, for the sake of convenience, the sequence of the film forming process illustrated in FIG. 4 may sometimes be denoted as follows. The same denotation will be used in the modifications and other embodiments to be described later.

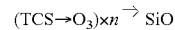

$(TCS \rightarrow O_3) \times n \rightarrow SiO$

When the term "wafer" is used herein, it may refer to "a wafer itself" or "a laminated body (aggregate) of a wafer and a predetermined layer or film formed on the surface of the wafer". That is to say, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Loading Step)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment Step)

The interior of the process chamber 201, namely the space in which the wafers 200 exist, is vacuum-exhausted (de-pressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature (a first temperature to be described later). In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Film Forming Step)

Next, the following two steps, i.e., steps 1 and 2, are sequentially performed.

[Step 1]

At this step, a TCS gas is supplied to the wafer 200 in the process chamber 201. At this time, the TCS gas is supplied into the process chamber 201 under a condition in which a flow rate of the TCS gas supplied into the process chamber 201 is larger than a flow rate of the TCS gas exhausted from the interior of the process chamber 201. This creates a state in which the exhaust system is substantially closed (a state substantially identical with or similar to a state in which the exhaust system is closed), namely a state in which the TCS gas is substantially confined in the process chamber 201 (a state substantially identical with or similar to a state in which the TCS gas is confined in the process chamber 201).

FIG. 4 illustrates an example where the condition (state) in which the flow rate of the TCS gas supplied into the process chamber 201 is larger than the flow rate of the TCS gas exhausted from the interior of the process chamber 201, is created by slightly opening the APC valve 244 (reducing the opening degree of the APC valve 244), for example, by increasing the set pressure of the interior of the process chamber 201. However, the present embodiment is not limited to this form. For example, the state in which the exhaust system is closed, namely the state in which the TCS gas is confined in the process chamber 201, may be created by completely closing the APC valve 244 when the TCS gas is supplied into the process chamber 201. In the present disclosure, for the sake of convenience, the state in which the exhaust system is substantially closed by slightly opening the APC valve 244 or the state in which the exhaust system is completely closed by completely closing the APC valve 244, will be often simply expressed as a state in which the exhaust system is closed (a state in which the exhaust of the interior of the process chamber 201 by the exhaust system is stopped). Furthermore, in the present disclosure, for the sake of convenience, the state in which the TCS gas is substantially confined in the process chamber 201 or the state in which the TCS gas is completely confined in the process chamber 201, will be often simply expressed as a state in which the TCS gas is confined in the process chamber 201.

In this state, namely in the state in which the APC valve 244 is slightly opened, the valve 243a is opened to allow the TCS gas to flow through the gas supply pipe 232a. The TCS gas is flow-rate-controlled by the MFC 241a and is supplied into the process chamber 201 via the nozzle 249a. Simultaneously, the valve 243c is opened to allow an $N_2$ gas to flow through the gas supply pipe 232c. The $N_2$ gas flowing through the gas supply pipe 232c is flow-rate-controlled by the MFC 241c and is supplied into the process chamber 201 together with the TCS gas. In order to prevent the TCS gas from entering the buffer chamber 237 and the nozzle 249b, the valve 243d is opened to allow the $N_2$ gas to flow through the gas supply pipe 232d. The $N_2$ gas is supplied into the process chamber 201 via the gas supply pipe 232d, the nozzle 249b and the buffer chamber 237.

By the processing procedure described above, it is possible to confine the TCS gas in the process chamber 201.

The supply flow rate of the TCS gas controlled by the MFC 241a may be set at a flow rate which falls within a range of, for example, 1 to 2,000 sccm, specifically 10 to 1,000 sccm. The supply flow rates of the $N_2$ gas controlled by the MFCs 241c and 241d may be respectively set at a flow rate which falls within a range of, for example, 100 to 10,000 sccm.

By supplying the TCS gas into the process chamber 201 while keeping the exhaust system in a closed state, the internal pressure of the process chamber 201 begins to increase. If the internal pressure of the process chamber 201 reaches a predetermined processing pressure, the supply of the TCS gas into the process chamber 201 is stopped to maintain a state in which the TCS gas is confined in the process chamber 201. The target internal pressure of the process chamber 201 (the processing pressure) is set at a pressure which falls within a range of, for example, 133 to 6,650 Pa (1 to 50 Torr), specifically 665 to 5,320 Pa (5 to 40 Torr), more specifically 933 to 2,660 Pa (7 to 20 Torr). This pressure zone is at least a pressure at which the TCS gas can be autolyzed (pyrolyzed) if the TCS gas exists alone in the process chamber 201 at a temperature zone to be described later.

If the processing pressure exceeds 6,650 Pa, there may be a case where an excessive gas phase reaction is generated and, consequently, an extraneous material is generated in the process chamber 201. Furthermore, there may be a case where the film thickness uniformity of a finally-formed SiO film is reduced. By setting the processing pressure at 6,650 Pa or less, it is possible to suppress the excessive gas phase reaction and to increase the film thickness uniformity. By setting the processing pressure at 5,320 Pa or less, it is possible to further suppress the excessive gas phase reaction and to further increase the film thickness uniformity. By setting the processing pressure at 2,660 Pa or less, it is possible to reliably avoid the excessive gas phase reaction and to even further increase the film thickness uniformity.

If the processing pressure is less than 133 Pa, the TCS gas supplied into the process chamber 201 is hardly pyrolyzed and the first layer (Si layer) is hardly formed on the wafer 200. Furthermore, an effect of desorption of Cl by the reaction with H to be described later is hardly obtained and Cl easily remains in the Si layer formed at step 1, namely in the finally-formed SiO film. By setting the processing pressure at 133 Pa or more, it is possible to sufficiently pyrolyze the TCS gas and to sufficiently increase the effect of desorption of Cl. By setting the processing pressure at 665 Pa or more, it is possible to further promote the pyrolysis of the TCS gas and to further increase the effect of desorption of Cl. By setting the processing pressure at 933 Pa or more, it is possible to reliably generate the pyrolysis of the TCS gas and to even further increase the effect of desorption of Cl.

The temperature of the heater 207 is set such that the temperature of the wafer 200 (the processing temperature) becomes a temperature falling within a range of, for example, 350 to 1,000 degrees C., specifically 500 to 800 degrees C. This temperature zone is at least a temperature at which the TCS gas can be autolyzed (pyrolyzed) if the TCS gas exists alone in the process chamber 201 at the aforementioned pressure zone.

If the processing temperature exceeds 1,000 degrees C., Si adsorbed onto the wafer 200 is easily agglomerated. Thus, there may be a case where the surface roughness of the Si layer formed at step 1, namely the finally-formed SiO film, deteriorates. Furthermore, there may be a case where an excessive gas phase reaction is generated and, consequently, an extraneous material is generated in the process chamber 201. Moreover, there may be a case where the film thickness uniformity of the SiO film formed on the wafer 200 is reduced. By setting the processing temperature at 1,000 degrees C. or less, it is possible to sufficiently avoid the agglomeration of Si or the generation of an extraneous material. By setting the processing temperature at 800 degrees C. or less, it is possible to reliably avoid the agglomeration of Si or the generation of an extraneous material. The term "surface roughness" used herein refers to a height difference in the plane of a wafer and has the same meaning as the surface coarseness. The expression "the surface roughness is improved" means that the height difference is reduced and the surface is smoothened. The expression "the surface roughness is deteriorated" means that the height difference is increased and the surface is roughened.

If the processing temperature is less than 350 degrees C., the TCS gas supplied into the process chamber 201 is hardly pyrolyzed and the Si layer is hardly formed on the wafer 200. Furthermore, an effect of desorption of Cl by the reaction with H to be described later is hardly obtained and Cl easily remains in the Si layer, namely in the finally-formed SiO film. Moreover, H easily remains in the Si layer, namely in the finally-formed SiO film. By setting the processing temperature at 350 degrees C. or more, it is possible to sufficiently pyrolyze the TCS gas and to sufficiently increase the effect of desorption of Cl or H. By setting the processing temperature at 500 degrees C. or more, it is possible to further promote the pyrolysis of the TCS gas and to further increase the effect of desorption of Cl or H.

The time period for supplying the TCS gas to the wafer 200 while keeping the exhaust system in a closed state, namely the gas supply time period (the confinement state maintaining time period), may be set to a time period which falls within a range of, for example, 1 to 100 seconds, specifically 5 to 60 seconds.

By supplying the TCS gas to the wafer 200 under the aforementioned processing conditions (the processing pressure, the processing temperature and the confinement time period), it is possible to pyrolyze TCS and to cut off an Si—H bond or an Si—Cl bond contained in TCS. H and Cl react with each other to generate a reaction byproduct such as HCl or the like and are desorbed (extracted) from Si. Si having a dangling bond as a result of cutoff of the bond of Si with H or Cl is deposited (adsorbed) on the wafer 200, thereby forming a Si—Si bond. Thus, as the first layer, a Si layer having a thickness of, for example, less than one atomic layer to several atomic layers is formed on the wafer 200 (on a base film formed on the surface of the wafer 200). The expression "a layer having a thickness of less than one atomic layer" used herein refers to a discontinuously-formed atomic layer, and the expression "a layer having a thickness of one atomic layer" used herein refers to a continuously-formed atomic layer.

If the thickness of the first layer formed on the wafer 200 exceeds several atomic layers, the oxidation action at step 2 to be described later does not reach the entirety of the first layer. The minimum value of the thickness of the first layer that can be formed on the wafer 200 is less than one atomic layer. Accordingly, the thickness of the first layer may be from less than one atomic layer to several atomic layers.

By setting the thickness of the first layer formed at step 1 to become several atomic layers, it is possible to increase the thickness of the second layer (SiO layer) formed per one cycle, namely the cycle rate. As a result, it becomes possible to increase the deposition rate.

Furthermore, by setting the thickness of the first layer formed at step 1 to become one atomic layer or less, namely one atomic layer or less than one atomic layer, it is possible to relatively increase the oxidation action at step 2, which will be described later, and to shorten the time required in oxidation at step 2. It is also possible to shorten the time required in forming the first layer at step 1. As a result, it is possible to shorten the processing time per one cycle and to shorten the total processing time. That is to say, it is possible to increase the deposition rate. In addition, by setting the thickness of the first layer to become one atomic layer or less, it is possible to enhance the controllability of the film thickness uniformity.

After the first layer (Si layer) is formed by maintaining the confinement state for a predetermined time, the APC valve 244 is opened and the interior of the process chamber 201 is vacuum-exhausted by the vacuum pump 246. Thus, the unreacted TCS gas, the TCS gas contributed to the formation of the first layer, the reaction byproduct, or the like, which remains in the process chamber 201, is removed from the interior of the process chamber 201. Furthermore, the supply of the $N_2$ gas into the process chamber 201 is maintained while opening the valves 243c and 243d. The $N_2$ gas acts as a purge gas. This makes it possible to enhance the effect of removing the unreacted gas, the gas contributed to the formation of the first layer, or the like, which remains in the process chamber 201, from the interior of the process chamber 201.

At this time, the gas remaining in the process chamber 201 may not be completely removed and the interior of the process chamber 201 may not be completely purged. If the amount of the gas remaining in the process chamber 201 is small, there is no possibility that an adverse effect is generated at step 2 which is performed later. In this case, it is not necessary to make the flow rate of the $N_2$ gas supplied into the process chamber 201 large. For example, by supplying the $N_2$ gas substantially in the same amount as the volume of the reaction tube 203 (the process chamber 201), it is possible to perform a purge operation such that an adverse effect is not generated at step 2. By not completely purging the interior of the process chamber 201, it is possible to shorten the purge time and to improve the throughput. In addition, it is possible to suppress the consumption of the $N_2$ gas to a necessary minimum level.

As the precursor gas, in addition to the TCS gas, it may be possible to use an MCS gas or a DCS gas. Furthermore, as the precursor gas, it may be possible to use a monochlorodisilane ($Si_2H_5Cl$) gas, a dichlorodisilane ($Si_2H_4Cl_2$) gas, a trichlorodisilane ($Si_2H_3Cl_3$) gas, a tetrachlorodisilane ($Si_2H_2Cl_4$) gas, a monochlorotrisilane ($Si_3H_5Cl$) gas, a dichlorotrisilane ($Si_3H_4Cl_2$) gas, or the like.

As the inert gas, it may be possible to use, in addition to the $N_2$ gas, a rare gas such as an Ar gas, a He gas, a Ne gas, a Xe gas or the like.

[Step 2]

After the first layer is formed on the wafer 200, an $O_3$ gas is supplied to the wafer 200 in the process chamber 201. At this time, the $O_3$ gas is supplied into the process chamber 201 while keeping the exhaust system in an open state.

Specifically, the opening degree of the APC valve 244 is appropriately adjusted and the exhaust of the interior of the process chamber 201 is implemented by the exhaust system. Furthermore, the opening/closing control of the valves 243b to 243d is performed in the same procedure as the opening/closing control of the valves 243a, 243c and 243d performed at step 1. The flow rate of the $O_3$ gas is controlled by the MFC 241b. The $O_3$ gas is supplied into the process chamber 201 via the nozzle 249b and the buffer chamber 237 and is exhausted from the exhaust pipe 231.

At this time, the supply flow rate of the $O_3$ gas controlled by the MFC 241b may be set at a flow rate which falls within a range of, for example, 10 to 10,000 sccm, specifically 100 to 1,000 sccm. The internal pressure of the process chamber 201 may be set at a pressure which falls within a range of, for example, 1 to 1,330 Pa, specifically 20 to 665 Pa. By setting the internal pressure of the process chamber 201 to fall within this pressure zone, it is possible to thermally activate the $O_3$ gas in a non-plasma manner. If the $O_3$ gas is supplied by thermally activating the same, it is possible to generate a relatively-soft reaction and to relatively softly perform the oxidation which will be described later. The time period for supplying the $O_3$ gas to the wafer 200, namely the gas supply time period (the irradiation time period), may be set at a time period which falls within a range of, for example, 1 to 100 seconds, specifically 5 to 60 seconds.

Other processing conditions may be similar to, for example, the processing conditions of step 1.

As the $O_3$ gas is supplied to the wafer 200 under the aforementioned conditions, at least a portion of the first layer (Si layer) formed on the wafer 200 at step 1 is oxidized (modified). As the first layer is modified, a silicon oxide layer (SiO layer) is formed as a second layer. Even if a small amount of impurity such as Cl, H or the like is contained in the first layer formed at step 1, the impurity makes up a gaseous material containing at least Cl or H in the course of a modifying reaction caused by the $O_3$ gas. Thus, the impurity is discharged from the interior of the process chamber 201. That is to say, the impurity such as Cl, H or the like contained in the first layer is extracted or desorbed from the first layer and is separated from the first layer. Thus, the second layer becomes a layer which is smaller in the amount of the impurity such as Cl, H or the like than the first layer.

As the oxidizing gas, in addition to the $O_3$ gas, it may be possible to suitably use, for example, a plasma-excited to oxygen ($O_2$) gas, a plasma-excited nitric oxide (NO) gas, a plasma excited nitrous oxide ($N_2O$) gas, or a plasma-excited nitrogen dioxide ($NO_2$) gas.

As the inert gas, in addition to the $N_2$ gas, it may be possible to use, for example, various kinds of rare gases mentioned above.

[Performing a Predetermined Number of Times]

A cycle which non-simultaneously, i.e., non-synchronously, performs steps 1 and 2 described above is implemented a predetermined number of times (n times), namely once or more. Thus, a SiO film having a predetermined composition and a predetermined thickness can be formed on the wafer 200. The aforementioned cycle may be repeated multiple times. That is to say, the thickness of the second layer (SiO layer) formed per cycle may be set to be smaller than a desired film thickness. The aforementioned cycle may be repeated multiple times until the film thickness of the SiO film formed by laminating the second layer becomes a desired film thickness.

(Atmospheric Pressure Return Step)

After the formation of the SiO film on the wafer 200 is completed, the valves 243c and 243d are opened. The $N_2$ gas is supplied from the gas supply pipes 232c and 232d into the process chamber 201 and is exhausted from the exhaust pipe 231. The $N_2$ gas acts as a purge gas. Thus, the interior of the process chamber 201 is purged and the gas or the reaction byproduct, which remains in the process chamber 201, is removed from the interior of the process chamber 201 (purge). Thereafter, the internal atmosphere of the process chamber 201 is substituted by an inert gas (inert gas substitution). The internal pressure of the process chamber 201 is returned to an atmospheric pressure (atmospheric pressure return).

(Unloading Step)

Thereafter, the seal cap 219 is moved down by the boat elevator 115 to open the lower end of the manifold 209. The processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging).

(3) Effects According to the Present Embodiment

According to the present embodiment, one or more effects set forth below may be achieved.

(a) At step 1, the TCS gas containing H and Cl is supplied to the wafer 200 in the process chamber 201, under the condition in which TCS is pyrolyzed if TCS exists alone and under the condition in which the flow rate of the TCS gas supplied into the process chamber 201 is larger than the flow rate of the TCS gas exhausted from the interior of the process chamber 201. This enables the SiO film formed on the wafer 200 to become a high-quality film having a low H concentration or a low Cl concentration. As a result, it is possible to improve the characteristics or the reliability of a semiconductor device manufactured by the wafer 200. Descriptions will be made below in detail.

First, descriptions will be made on the problems found by the present inventors. According to the extensive studies of the inventors, it was found that if an H-free chlorosilane precursor gas such as, e.g., a hexachlorodisilane ($Si_2Cl_6$, abbreviation: HCDS) gas or the like is used as a precursor, a large amount of impurity such as H or the like may be mixed into a SiO film even though an H-free oxidizing gas such as an $O_3$ gas or the like is used as a reactant. That is to say, it was found that even though H-free substances are used as a precursor and a reactant, a large amount of H or the like is mixed into a finally-formed film.

Furthermore, according to the extensive studies of the inventors, it was found that if an H-free chlorosilane precursor gas such as an HCDS gas or the like is used as a precursor, an impurity such as H or the like may be mixed into a SiO film in a larger amount than when using an H-containing silane precursor gas such as a trisdimethylaminosilane ($Si[N(CH_3)_2]_3H$, abbreviation: 3DMAS) gas, a monosilane ($SiH_4$, abbreviation: MS) gas or the like. That is to say, it was found that despite the use of an H-free substance as a precursor, an impurity such as H or the like may be mixed into a finally-formed film in a larger amount than when using an H-containing substance as a precursor.

According to the further extensive studies of the inventors, it was found that this is because a halogen element (Cl) remaining in a film acts to attract moisture ($H_2O$). If a SiO film is formed using a chlorosilane precursor gas such as an HCDS gas or the like, a small amount of Cl may remain in a film. If the surface of the SiO film containing Cl is exposed to the air, $H_2O$ or the like contained in the air may be attracted toward Cl and may be introduced into the film. As a result, a large amount of impurity such as H or the like is mixed into the SiO film. H mixed into the SiO film may affect the characteristics or the reliability of a semiconductor device formed on the wafer 200.

In order to cope with the problems which have been made clear by the extensive studies of the inventors, in the present embodiment, the TCS gas containing H and Cl is used as the precursor gas. That is to say, for the purpose of reducing the H concentration or the Cl concentration in the SiO film, the hydrogenated chlorosilane precursor gas containing H and Cl is intentionally used. By supplying the TCS gas under the aforementioned processing procedures and processing conditions (processing pressure and processing temperature) at step 1, H and Cl contained in TCS are caused to react with each other so that H or Cl is desorbed from Si contained in TCS. Thus, it is possible to significantly reduce the H concentration or the Cl concentration in the first layer. As a result, it is possible to enable the SiO film formed on the wafer 200 to become a high-quality film having a low H concentration or a low Cl concentration. Furthermore, according to the present embodiment, by sufficiently reducing the Cl concentration in the SiO film formed on the wafer 200, it is possible to suppress the introduction of $H_2O$ into the SiO film which is exposed to air when the processed (film formed) wafer 200 is unloaded into the air (when the furnace opening is opened). As a result, the SiO film formed on the wafer 200 can be maintained at a high-quality state with the H concentration or the like kept low.

(b) At step 1, the TCS gas is supplied into and confined in the process chamber 201. This state is maintained for a predetermined period of time. It is therefore possible to increase the percentage of the TCS gas contributed to the formation of the first layer, namely the use efficiency of the TCS gas. As a result, it is possible to reduce the film forming cost (the gas cost). Furthermore, by maintaining the confinement state of the TCS gas, it is possible to increase the formation rate of the first layer formed on the wafer 200, namely the deposition rate of the SiO film formed on the wafer 200. In addition, by maintaining the confinement state of the TCS gas, it is possible to further promote the reaction of H and Cl contained in the TCS gas, namely desorption of H or Cl from Si.

(c) At step 1, the APC valve 244 is not completely closed but is slightly opened. By doing so, a gas flow moving from the interior of the process chamber 201 toward the exhaust pipe 231 can be slightly formed when the TCS gas is confined in the process chamber 201. This makes it possible to remove the reaction byproduct such as HCl or the like generated in the process chamber 201 from the interior of the process chamber 201 and to improve the quality of the film forming process. For example, it is possible to prevent H contained in HCl or the like from being introduced into the SiO film or from reacting with Si contained in the SiO film to form a Si—H bond. In addition, for example, it is possible to avoid the etching damage of the SiO film or the internal members of the process chamber 201, which may otherwise be caused by HCl generated in the process chamber 201.

Alternatively, as described above, at step 1, the APC valve 244 may be completely closed. By doing so, it is possible to increase the internal pressure of the process chamber 201 within a short period of time and to further increase the formation rate of the first layer on the wafer 200, namely the deposition rate of the SiO film on the wafer 200. In addition, it is possible to further increase the use efficiency of the TCS gas and to further reduce the film forming cost.

(d) At step 2, the $O_3$ gas, which is an H-free (hydrogen-free) O-containing gas, is used as the oxidizing gas. Thus, when oxidizing the first layer, it is possible to prevent the addition of H to the first layer and to avoid the increase of the H concentration in the finally-formed SiO film. The inventors have found that if an oxidizing process is performed using the oxidizing species obtained by allowing an $O_2$ gas and an $H_2$ gas to react with each other, or if an oxidizing process is performed using an $H_2O$ gas, H may be added to the first layer when oxidizing the first layer.

(e) At step 2, the $O_3$ gas having strong oxidizing power is used as the oxidizing gas. This makes it possible to reliably perform the oxidation of the first layer formed at step 1. Furthermore, even if a small amount of impurity such as Cl, H or the like is contained in the first layer, it is possible to efficiently desorb the impurity from the interior of the first layer. This enables the finally-formed SiO film to become a high-quality film having an extremely-low impurity concentration.

(f) The aforementioned effects can be similarly achieved even in the case where the aforementioned hydrogenated chlorosilane precursor gases other than the TCS gas are used as the precursor or in the case where the aforementioned O-containing gases other than the $O_3$ gas are used as the reactant.

(4) Modifications

The substrate processing sequence of the present embodiment is not limited to the one illustrated in FIG. 4 but may be modified as in the modifications described below.

(Modification 1)

Figure 5:
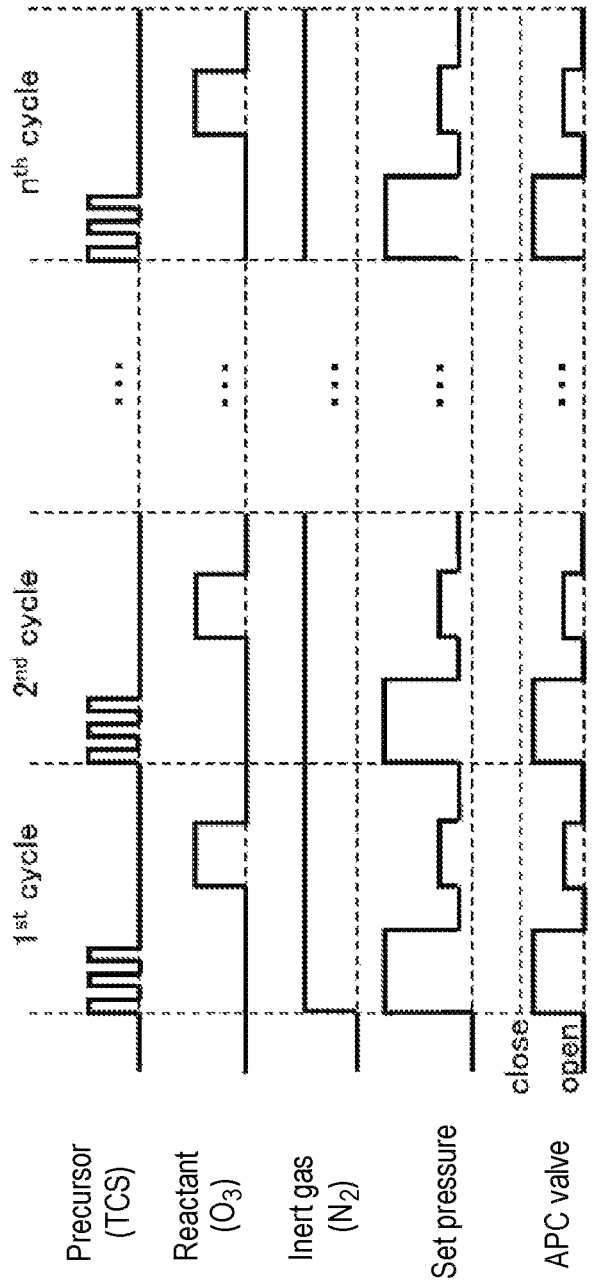
FIG. 5 is a view illustrating a modification of the film forming sequence according to one embodiment of the present disclosure.

At step 1, the supply of the TCS gas into the process chamber 201 may be intermittently repeated in a state in which the exhaust system is substantially closed or in a state in which the exhaust system is completely closed. FIG. 5 illustrates an example where at step 1, the supply of the TCS gas is intermittently performed three times in a state in which the exhaust system is substantially closed. For the sake of convenience, the film forming sequence of this modification may be denoted as follows.

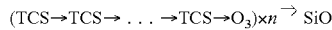

Even in this modification, it is possible to achieve the same effects as those of the film forming sequence illustrated in FIG. 4. Furthermore, by intermittently performing the supply of the TCS gas, it is possible to more effectively perform desorption of Cl in the course of forming the first layer. As a result, it is possible to enable the SiO film formed on the wafer 200 to become a high-quality film having a lower H concentration or a lower Cl concentration.

(Modification 2)

Figure 6:
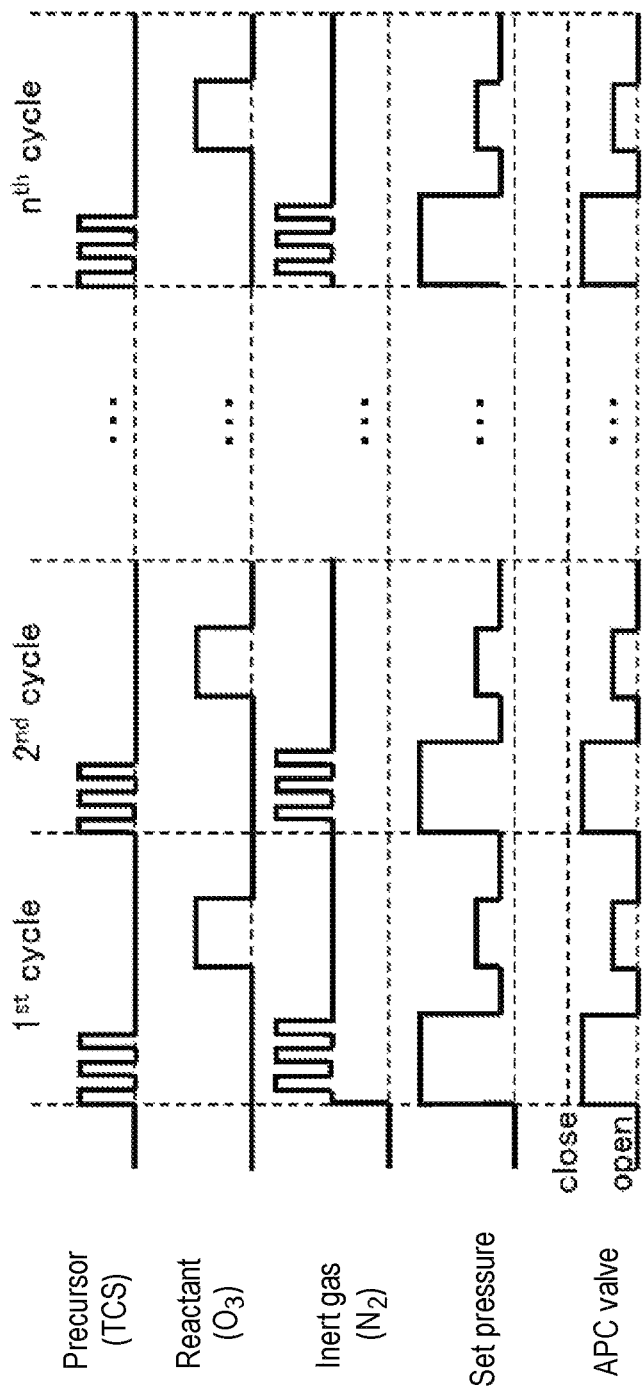
FIG. 6 is a view illustrating another modification of the film forming sequence according to one embodiment of the present disclosure.

At step 1, the supply of the TCS gas into the process chamber 201 may be intermittently repeated in a state in which the exhaust system is substantially closed or in a state in which the exhaust system is completely closed, and the supply flow rate of the $N_2$ gas in the stop period of the supply of the TCS gas may be temporarily kept higher than the supply flow rate of the $N_2$ gas in the supply period of the TCS gas (high flow rate purge may be performed). That is to say, at step 1, the supply of the TCS gas into the process chamber 201 and the high flow rate purge of the interior of the process chamber 201 may be alternately repeated in a state in which the exhaust system is substantially or completely closed. FIG. 6 illustrates an example where at step 1, the supply of the TCS gas and the high flow rate purge of the interior of the process chamber 201 are alternately performed three times in a state in which the exhaust system is substantially closed.

Even in this modification, it is possible to achieve the same effects as those of the film forming sequence illustrated in FIG. 4 or modification 1. Furthermore, by performing the control of the flow rate of the $N_2$ gas at step 1 in the aforementioned manner, it is possible to promote removal of the reaction byproduct such as HCl or the like from the interior of the process chamber 201 and to further improve the quality of the film forming process.

(Modification 3)

Figure 7:
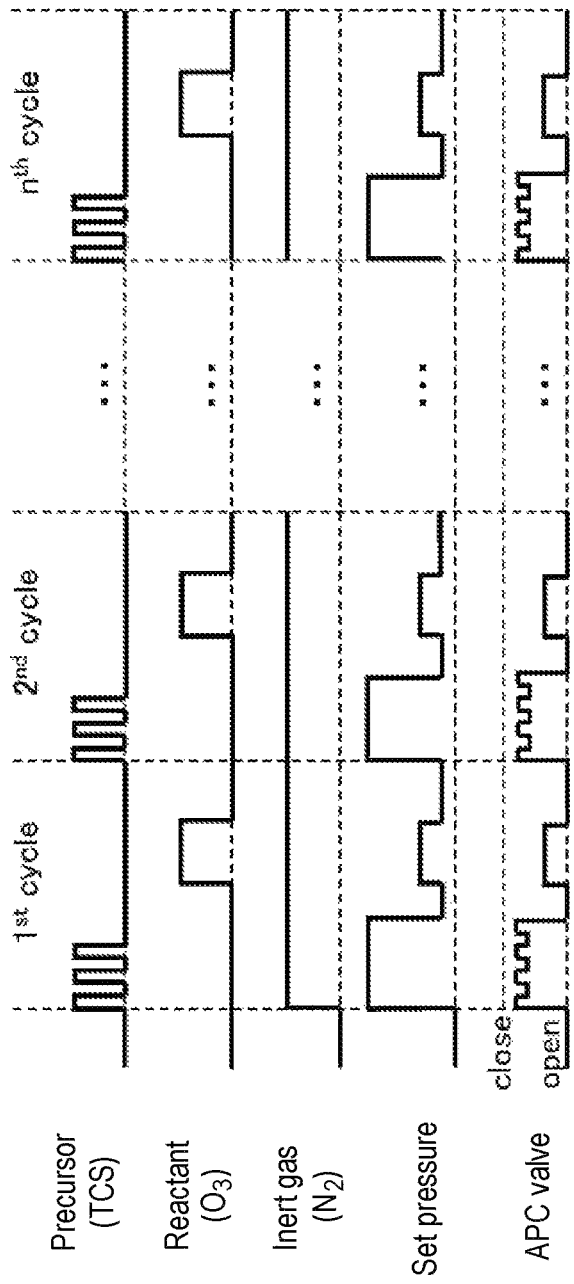
FIG. 7 is a view illustrating another modification of the film forming sequence according to one embodiment of the present disclosure.

At step 1, the supply of the TCS gas into the process chamber 201 may be intermittently repeated in a state in which the exhaust system is substantially closed or in a state in which the exhaust system is completely closed, and the opening degree of the APC valve 244 in the stop period of the supply of the TCS gas may be temporarily kept larger than the opening degree of the APC valve 244 in the supply period of the TCS gas (the exhaust rate may be increased). That is to say, at step 1, the supply of the TCS gas into the process chamber 201 and the operation of making the exhaust rate of the exhaust system at the time of stoppage of the supply of the TCS gas higher than the exhaust rate at the time of supply of the TCS gas may be alternately repeated. FIG. 7 illustrates an example where at step 1, the supply of the TCS gas performed in a state in which the exhaust system is substantially closed and the operation of making the exhaust rate of the exhaust system at the time of stoppage of the supply of the TCS gas higher than the exhaust rate at the time of supply of the TCS gas are alternately performed three times.

Even in this modification, it is possible to achieve the same effects as those of the film forming sequence illustrated in FIG. 4 or modification 1. Furthermore, by performing the control of the opening degree of the APC valve 244 at step 1 in the aforementioned manner, similar to modification 2, it is possible to promote removal of the reaction byproduct such as HCl or the like from the interior of the process chamber 201 and to further improve the quality of the film forming process.

(Modification 4)

Figure 8:
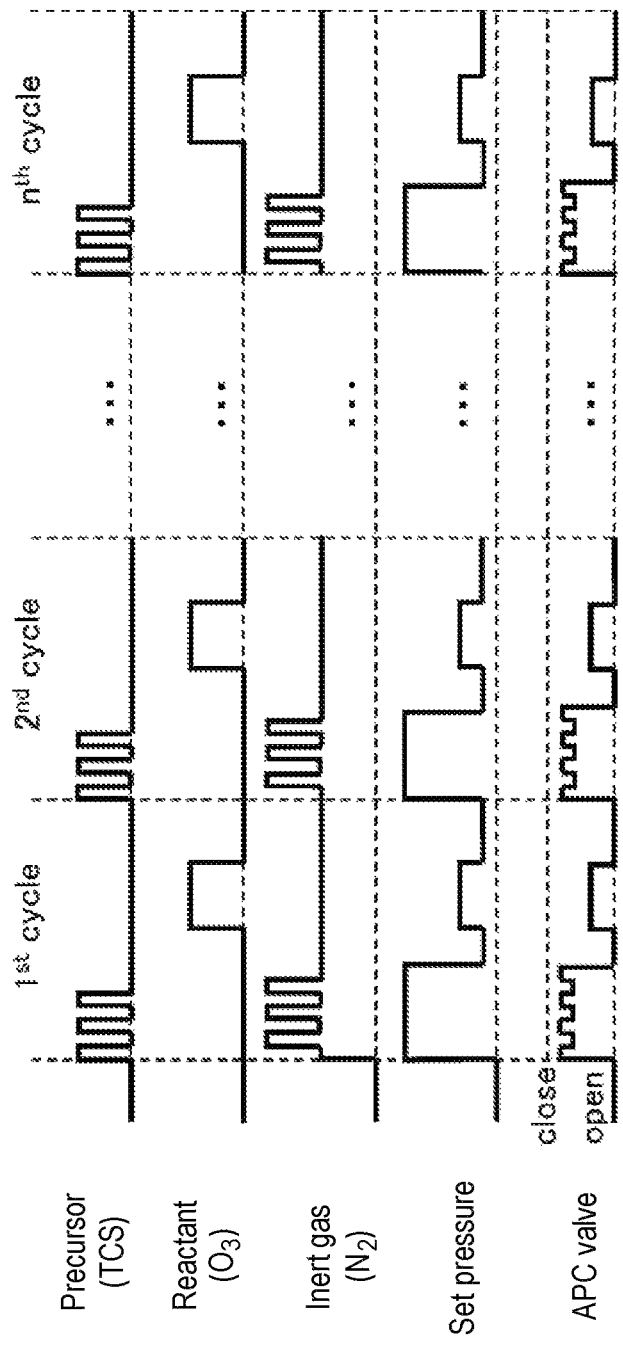
FIG. 8 is a view illustrating another modification of the film forming sequence according to one embodiment of the present disclosure.

As illustrated in FIG. 8, modifications 2 and 3 described above may be combined with each other. That is to say, at step 1, the supply of the TCS gas into the process chamber 201, the high flow rate purge of the interior of the process chamber 201 and the operation of making the exhaust rate of the exhaust system at the time of stoppage of the supply of the TCS gas higher than the exhaust rate at the time of supply of the TCS gas may be alternately repeated. This makes it possible to further promote removal of the reaction byproduct such as HCl or the like from the interior of the process chamber 201 and to further improve the quality of the film forming process.

In modifications 1 to 4, the aforementioned respective effects can be made higher when the exhaust system is substantially closed at step 1, namely when the exhaust system is slightly opened to slightly exhaust a gas from the exhaust system, than when the exhaust system is completely closed at step 1.

(Modification 5)

Figure 9:
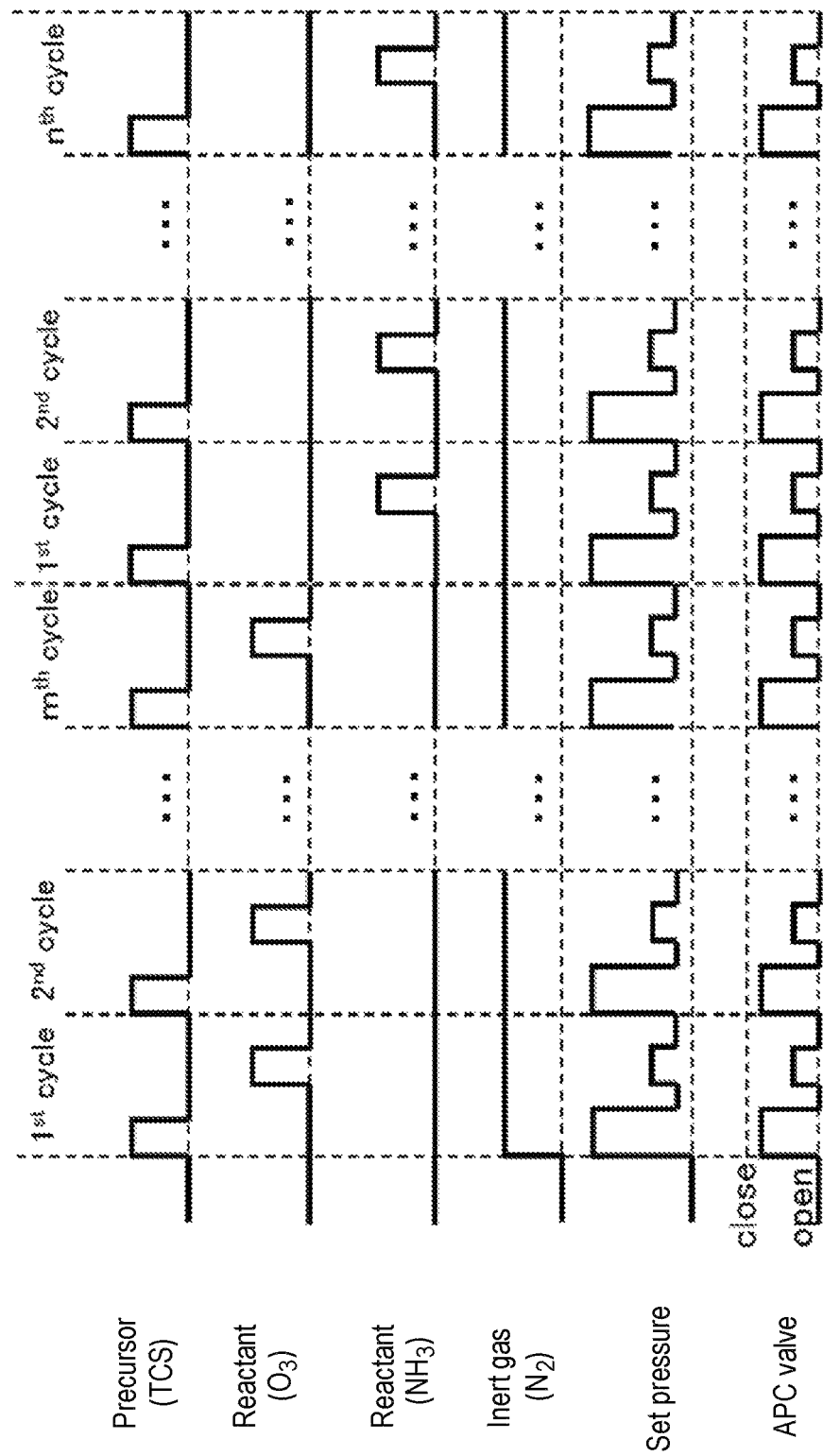
FIG. 9 is a view illustrating another modification of the film forming sequence according to one embodiment of the present disclosure.

As illustrated in FIG. 9, after the SiO film is formed on the wafer 200, a cap layer may be formed on the SiO film, in situ, within the same process chamber 201. The cap layer functions as a block layer which prevents $H_2O$ existing in the air from reaching (making contact with) the SiO film when the processed (film formed) wafer 200 is unloaded into the air. By forming the cap layer on the SiO film in a state in which the processed wafer 200 is accommodated in the process chamber 201 without removing the same from the interior of the process chamber 201 after implementing the process of forming the SiO film, it is possible to reliably prevent introduction of $H_2O$ into the SiO film even when a small amount of Cl remains in the SiO film.

After terminating the role of protecting the SiO film, the cap layer is removed by a specified etching process. For that reason, it is preferred that the cap layer is made of a material differing in etching resistance from the SiO film. For example, as the cap layer, a silicon layer (Si layer) or a silicon nitride layer (SiN layer) may be formed on the SiO film. The Si layer may be formed by performing, a predetermined number of times (once or more), a step of supplying a silane precursor gas as a precursor to the wafer 200 in the process chamber 201. The SiN layer may be formed by simultaneously or non-simultaneously performing, a predetermined number of times (once or more), a step of supplying a silane precursor gas as a precursor to the wafer 200 in the process chamber 201 and a step of supplying a nitriding gas such as an $NH_3$ gas or the like as a reactant to the wafer 200 in the process chamber 201.

In the process of forming the cap layer, similar to the film forming sequence illustrated in FIG. 4, a TCS gas containing H and Cl may be used as a precursor gas. Similar to step 1 of the film forming sequence illustrated in FIG. 4, the TCS gas may be supplied under a condition in which TCS is pyrolyzed if TCS exists alone and under a condition in which a flow rate of the TCS gas supplied into the process chamber 201 is larger than a flow rate of the TCS gas exhausted from the interior of the process chamber 201. Moreover, the state in which the TCS gas is confined in the process chamber 201 may be maintained for a predetermined period of time. By doing so, it is possible to sufficiently reduce an H concentration or a Cl concentration in the cap layer. Consequently, it becomes possible to suppress diffusion of H or Cl from the cap layer into the SiO film. The technical significance of reduction of the H concentration or the Cl concentration in the cap layer grows particularly large in the case of implementing a high-temperature process in which diffusion of H or Cl into the wafer 200 is likely to occur after formation of the cap layer. However, if a high-temperature process is not implemented with respect to the wafer 200 after formation of the cap layer and if diffusion of H or Cl is not likely to occur, the confinement of the TCS gas may not be executed when forming the cap layer.

The thickness of the cap layer may be set at a thickness which falls within a range of, for example, several atomic layers or more to several tens of atomic layers or less. If the thickness of the cap layer is less than several atomic layers, for example, about one atomic layer, the function of the cap layer as the aforementioned block layer may be insufficient. By setting the thickness of the cap layer to become several atomic layers or more, it is possible to enable the cap layer to sufficiently serve as the block layer. If the thickness of the cap layer exceeds several tens of atomic layers, for example, 100 atomic layers, the processing time required in removing the cap layer may be prolonged. This may lead to a reduction of the productivity of the semiconductor device. By setting the thickness of the cap layer to become several tens of atomic layers or less, it is possible to avoid the reduction of the productivity of the semiconductor device.

For the sake of convenience, the film forming sequence, in which a SiO film is formed by alternately supplying the TCS gas and the $O_3$ gas to the wafer 200 m times and then a cap layer (SiN layer) is formed by alternately supplying the TCS gas and the $NH_3$ gas to the wafer 200 n times, may be denoted as follows. The processing procedures and processing conditions of the step of supplying the $NH_3$ gas may be similar to the processing procedures and processing conditions of step 2 of the film forming sequence illustrated in FIG. 4. The $NH_3$ gas may be supplied by plasma-exciting the same.

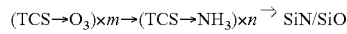

(Modification 6)

As described above, at step 2, the plasma-excited $O_2$ gas or the like may be supplied. In the case where the plasma-excited $O_2$ gas is supplied to the wafer 200, the supply flow rate of the $O_2$ gas controlled by the MFC 241b may be set at a flow rate which falls within a range of, for example, 100 to 10,000 sccm. The high-frequency power (RF power) applied to between the rod-shaped electrodes 269 and 270 may be set so that the electric power falls within a range of, for example, 50 to 1,000 W. The internal pressure of the process chamber 201 may be set at a pressure which falls within a range of, for example, 1 to 1,330 Pa, specifically 1 to 665 Pa, more specifically 1 to 100 Pa. Other processing procedures and processing conditions may be similar to the processing procedures and processing conditions described above. Even in this modification, the same effects as those of the film forming sequence illustrated in FIG. 4 are achieved. For the sake of convenience, the film forming sequence of this modification may be denoted as follows.

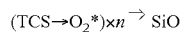

(Modification 7)

Figure 12:
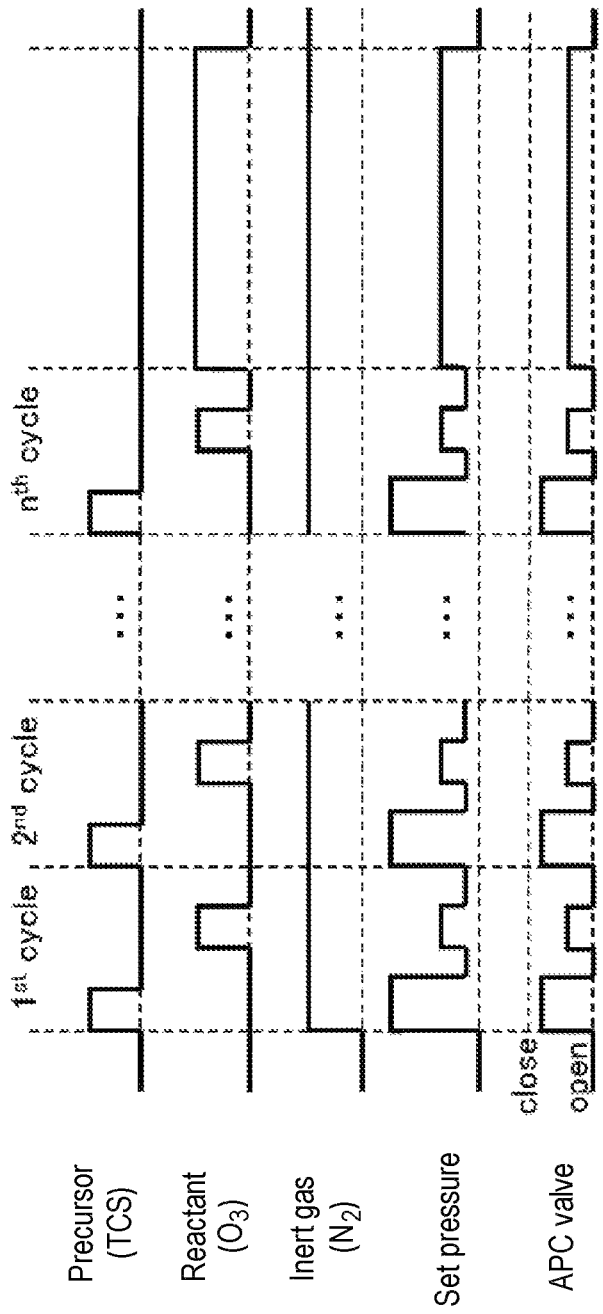
FIG. 12 is a view illustrating another modification of the film forming sequence according to one embodiment of the present disclosure.

As illustrated in FIG. 12, the surface of the SiO film may be modified by performing a step of supplying an $O_3$ gas or a plasma-excited $O_2$ gas to the surface of the SiO film after the SiO film is formed on the wafer 200. The supply time period of the $O_3$ gas or the like at the step of modifying the surface of the SiO film may be set, for example, longer than the supply time period of the $O_3$ gas at step 2 and may be set at a time period which falls within a range of, for example, 120 to 600 seconds. This makes it possible to further desorb H or Cl from the surface of the SiO film and to further improve the film quality of the SiO film. In addition, by further desorbing Cl from the surface of the SiO film, it is possible to reliably suppress introduction of $H_2O$ into the SiO film exposed to the air.

(Modification 8)

As described above, at step 1, H and Cl are desorbed by allowing H and Cl contained in the precursor to react with each other. However, depending on the ratio of the amount of H contained in the precursor to the amount of Cl contained in the precursor, there may be a case where one of H and Cl remains in the first layer in a larger amount than the other. In order to reduce both H and Cl from the first layer in a balanced manner, it may be effective to supply an H-free Cl-containing gas such as a $Cl_2$ gas or the like, or a Cl-free H-containing gas such as an $H_2$ gas, a $SiH_4$ gas or the like, together with the precursor.

Figure 10:
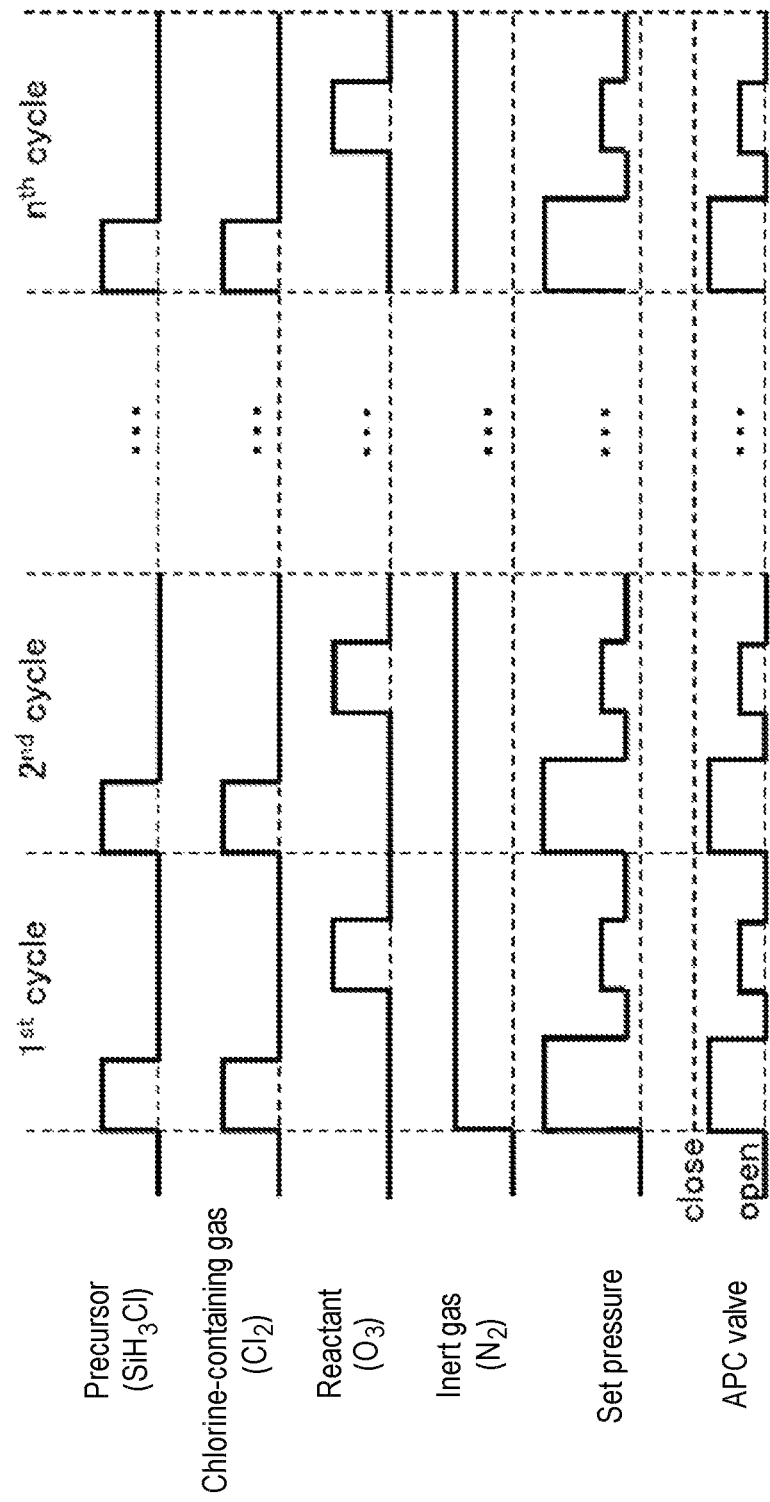
FIG. 10 is a view illustrating another modification of the film forming sequence according to one embodiment of the present disclosure.

For example, if a substance ($SiH_3Cl$, $Si_2H_5Cl$, $Si_2H_4Cl_2$, $Si_3H_5Cl$, $Si_3H_4Cl_2$ or the like), in which the number of Cl atoms contained in one molecule is smaller than the number of H atoms contained in one molecule, is used as the precursor gas, there may be a case where a relatively-large amount of H remains in the first layer. In this case, as illustrated in FIG. 10, at step 1, a $Cl_2$ gas or the like may be supplied together with the precursor gas. For example, if a $SiH_3Cl$ gas is used as the precursor gas, the $SiH_3Cl$ gas and the $Cl_2$ gas may be simultaneously supplied at a flow rate ratio of 1:1 or the like. By properly adjusting the flow rate ratio, it is possible to reduce both H and Cl from the first layer in a balanced manner.

Figure 11:
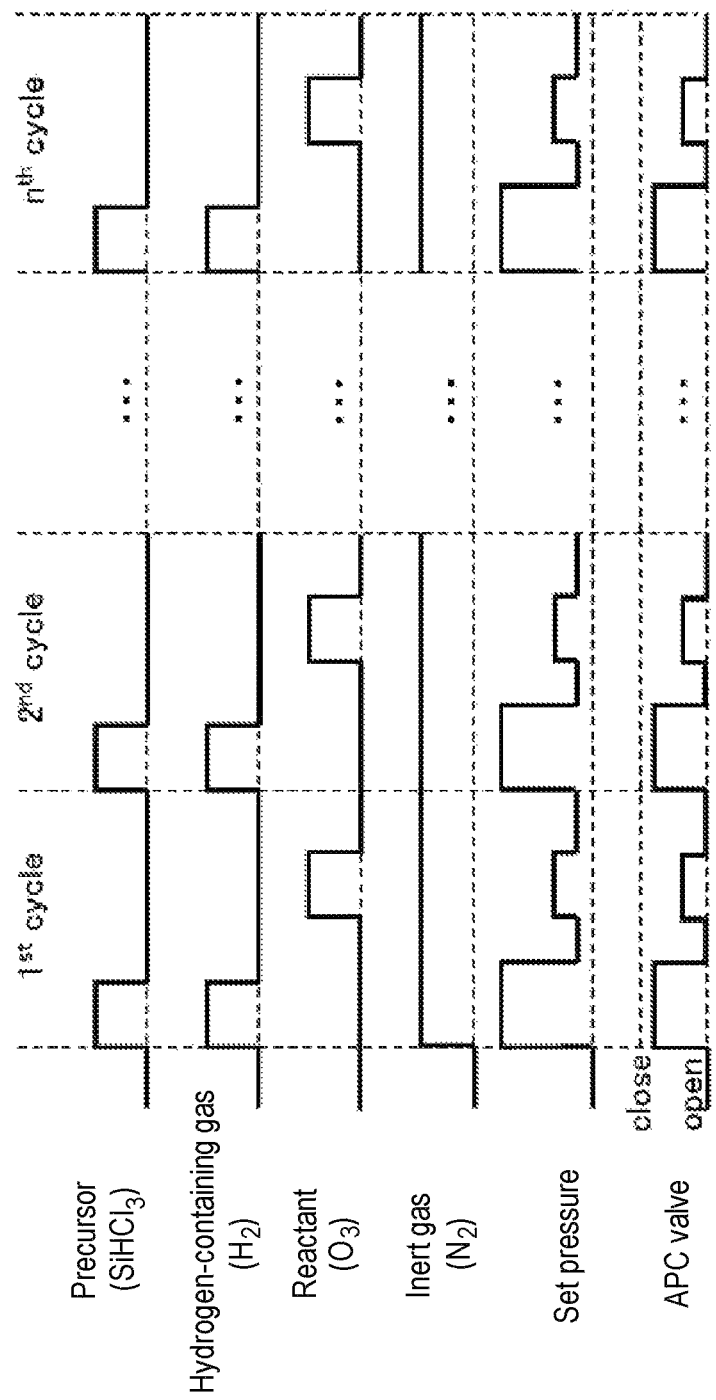
FIG. 11 is a view illustrating another modification of the film forming sequence according to one embodiment of the present disclosure.

In addition, for example, if a substance ($SiHCl_3$, $Si_2H_2Cl_4$ or the like), in which the number of Cl atoms contained in one molecule is larger than the number of H atoms contained in one molecule, is used as the precursor gas, there may be a case where a relatively-large amount of Cl remains in the first layer. In this case, as illustrated in FIG. 11, at step 1, an $H_2$ gas, a $SiH_4$ gas or the like may be supplied together with the precursor gas. For example, if a $SiHCl_3$ gas is used as the precursor gas, the $SiHCl_3$ gas and the $H_2$ gas may be simultaneously supplied at a flow rate ratio of 1:1 or the like. By properly adjusting the flow rate ratio, it is possible to reduce both H and Cl from the first layer in a balanced manner.

Furthermore, if a substance ($SiH_2Cl_2$, $Si_2H_3Cl_3$ or the like), in which the number of H atoms contained in one molecule is equal to the number of Cl atoms contained in one molecule, is used as the precursor gas, it is relatively easy to reduce both H and Cl from the first layer in a balanced manner. However, depending on the processing conditions such as a processing pressure, a processing temperature or the like used at step 1, there may be a case where one of H and Cl remains in the first layer in a larger amount than the other. In this case, by supplying one of the $Cl_2$ gas and the $H_2$ gas together with the precursor gas at a predetermined flow rate, it is possible to reduce both H and Cl from the first layer in a balanced manner.

Furthermore, a substance, in which the number of Cl atoms contained in one molecule is smaller than the number of H atoms contained in one molecule, and a substance, in which the number of Cl atoms contained in one molecule is larger than the number of H atoms contained in one molecule, may be mixed with each other at a predetermined ratio and may be used as the precursor gas. For example, a $SiH_3Cl$ gas and a $SiHCl_3$ gas may be mixed with each other at a ratio of 1:1 or the like and may be used as the precursor gas. By properly adjusting the ratio of the gases, it is possible to reduce both H and Cl from the first layer in a balanced manner.

Furthermore, a substance, in which the number of H atoms contained in one molecule is equal to the number of Cl atoms contained in one molecule, and a substance, in which the number of H atoms contained in one molecule differs from the number of Cl atoms contained in one molecule, may be mixed with each other at a predetermined ratio and may be used as the precursor gas. For example, a $SiH_2Cl_2$ gas, a $SiH_3Cl$ gas and a $SiHCl_3$ gas may be mixed with one another at a ratio of 2:1:1 or the like and may be used as the precursor gas. This makes it possible to reduce both H and Cl from the first layer in a balanced manner. By properly adjusting the ratio of the gases, it is possible to reduce both H and Cl from the first layer in a balanced manner.

Other Embodiments of the Present Disclosure

While one embodiment of the present disclosure has been specifically described above, the present disclosure is not limited to the aforementioned embodiment but may be differently modified without departing from the spirit of the present disclosure.

For example, in the aforementioned embodiment, there has been described an example where the reactant is supplied after supplying the precursor. However, the present disclosure is not limited to this example. The supply order of the precursor and the reactant may be reversed. That is to say, the precursor may be supplied after supplying the reactant. By changing the supply order, it is possible to change the quality or the composition ratio of the film as formed.

Furthermore, in the aforementioned embodiment, there has been described an example where the hydrogenated chlorosilane precursor gas is used as the precursor gas. The present disclosure is not limited to this example. A hydrogenated halosilane precursor gas other than the hydrogenated chlorosilane precursor gas, for example, a hydrogenated fluorosilane precursor gas or a hydrogenated bromosilane precursor gas, may be used as the precursor gas. The processing conditions used at this time may be similar to, for example, the processing conditions of the aforementioned embodiment.

By using the silicon-based insulation film formed by the method of the aforementioned embodiment as a sidewall spacer, it is possible to provide a device formation technique which is low in leak current and superior in workability. Furthermore, by using the silicon-based insulation film as an etching stopper, it is possible to provide a device formation technique which is superior in workability. Moreover, except for some modifications, it is possible to form the silicon-based insulation film without having to use plasma. This makes it possible to adapt the present disclosure to a process for forming, e.g., a SADP film of a DPT, in which plasma damage is a concern.

Furthermore, the present disclosure may be suitably applied to a case where an oxide film containing a metal element such as titanium (Ti), zirconium (Zr), hafnium (Hf), tantalum (Ta), niobium (Nb), aluminum (Al), molybdenum (Mo), tungsten (W) or the like, namely a metal-based oxide film, is formed on the wafer 200. That is to say, the present disclosure may be suitably applied to a case where a TiO film, a ZrO film, a HfO film, a TaO film, an NbO film, an AlO film, a MoO film or a WO film is formed on the wafer 200.

For example, the present disclosure may be suitably applied to a case where a metal compound (hereinafter referred to as a metal precursor) containing the aforementioned metal element, H and Cl is used as the precursor and where each of the aforementioned metal-based oxide films is formed on the wafer 200 according to the film forming sequences denoted below.

$$(\text{metal precursor} \rightarrow O_3) \times n \rightarrow \text{metal-based oxide film}$$

$$(\text{metal precursor} \rightarrow O_2^*) \times n \rightarrow \text{metal-based oxide film}$$

$$(\text{metal precursor} \rightarrow \text{metal precursor} \rightarrow \ldots \rightarrow \text{metal precursor} \rightarrow O_3) \times n \rightarrow \text{metal-based oxide film}$$

$$(\text{metal precursor} \rightarrow \text{metal precursor} \rightarrow \ldots \rightarrow \text{metal precursor} \rightarrow O_2^*) \times n \rightarrow \text{metal-based oxide film}$$

That is to say, the present disclosure may be suitably applied to a case where an oxide film containing a semiconductor element or a metal element is formed. The processing procedures and processing conditions of the film forming process may be similar to the processing procedures and processing conditions of the embodiment or the modifications described above. Even in this case, the same effects as those of the embodiment or the modifications described above are achieved.

Recipes (programs describing processing procedures and processing conditions) used in substrate processing may be prepared individually according to the processing contents (the kind, composition ratio, quality, film thickness, processing procedure and processing condition of the film as formed) and may be stored in the memory device 121c via a telecommunication line or the external memory device 123. Moreover, at the start of substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden (e.g., a burden borne by an operator when inputting processing procedures and processing conditions) and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace. Even in these cases, the processing procedures and the processing conditions may be similar to, for example, the processing procedures and the processing conditions of the aforementioned embodiment.

Figure 14:
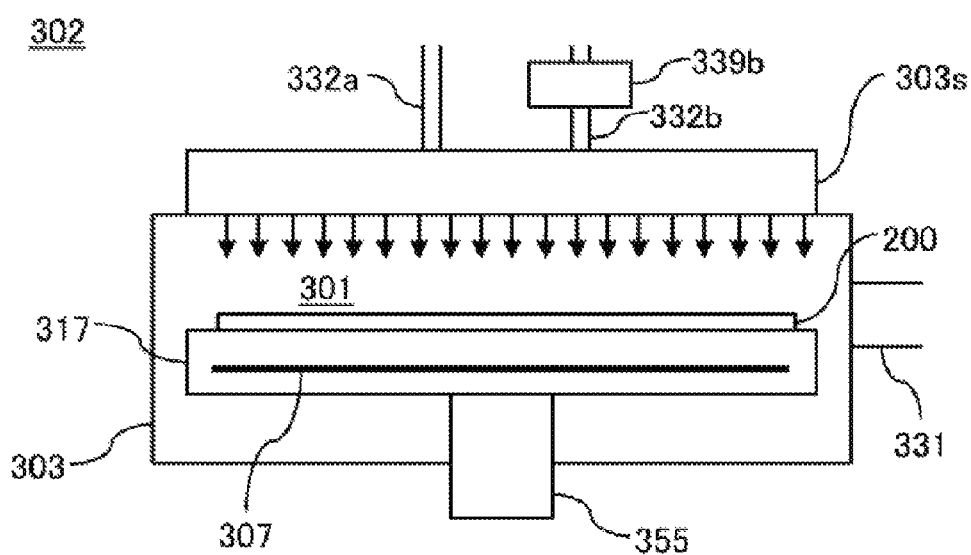
FIG. 14 is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 illustrated in FIG. 14. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets (gas introduction holes) of the shower head 303s. A gas supply system similar to the first supply system of the aforementioned embodiment is connected to the gas supply port 332a. A remote plasma unit (plasma generation device) 339b as an excitation part for plasma-exciting and supplying a gas and a gas supply system similar to the second supply system of the aforementioned embodiment are respectively connected to the gas supply port 332b. A gas distribution plate configured to supply a gas into the process chamber 301 in a shower-like manner is installed in outlets (gas discharge holes) of the shower head 303s. The shower head 303s is installed in such a position as to face the surfaces of the wafers 200 carried into the process chamber 301. An exhaust port 331 configured to exhaust the interior of the process chamber 301 is installed in the process vessel 303. An exhaust system similar to the exhaust system of the aforementioned embodiment is connected to the exhaust port 331.

Figure 15:
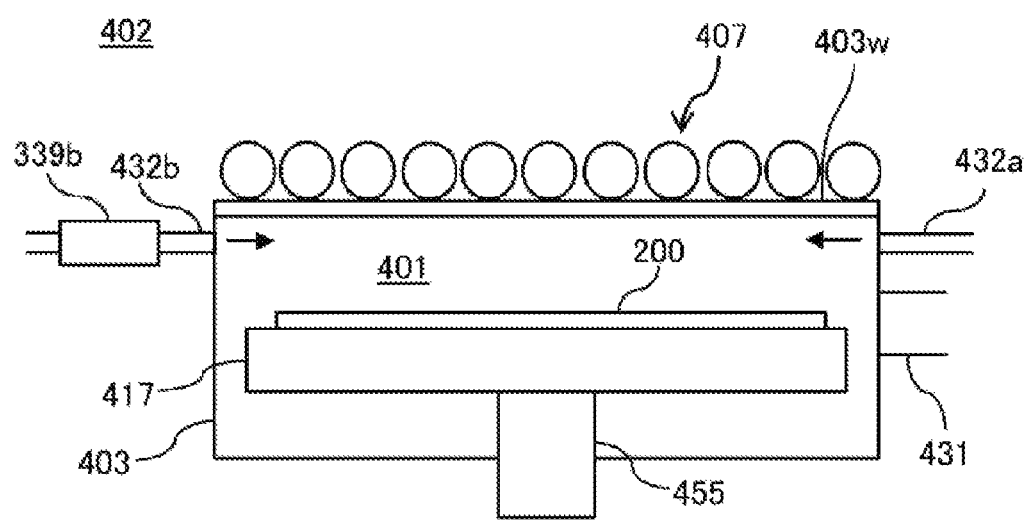
FIG. 15 is a schematic configuration view of a processing furnace of a substrate processing apparatus suitably used in another embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 15. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407. Gas supply ports 432a and 432b are connected to the process vessel 403. A supply system similar to the first supply systems of the aforementioned embodiment is connected to the gas supply port 432a. The aforementioned remote plasma unit 339b and a supply system similar to the second supply system of the aforementioned embodiment are respectively connected to the gas supply port 432b. The gas supply ports 432a and 432b are respectively installed at the lateral side of the end portions of the wafers 200 carried into the process chamber 401, namely in such positions as not to face the surfaces of the wafers 200 carried into the process chamber 401. An exhaust port 431 configured to exhaust the interior of the process chamber 401 is installed in the process vessel 403. An exhaust system similar to the exhaust system of the aforementioned embodiment is connected to the exhaust port 431.

In the case of using these substrate processing apparatuses, a film forming process may be performed by the processing procedures and processing conditions similar to those of the embodiment and modifications described above. Effects similar to those of the embodiment and modifications described above may be achieved.

The embodiment and modifications described above may be appropriately combined with one another. In addition, the processing conditions used at this time may be similar to, for example, the processing conditions of the embodiment described above.

[Example]

Descriptions will now be made on the results of tests which support the effects achieved in the embodiment and modifications described above.

A SiO film as a sample 1 was formed on a wafer through the use of the substrate processing apparatus of the aforementioned embodiment and according to the film forming sequence illustrated in FIG. 4. A TCS gas was used as the precursor. An $O_3$ gas was used as the reactant. The processing procedures and processing conditions were the same as those of the aforementioned embodiment. That is to say, at the step of supplying the TCS gas, the flow rate of the TCS gas supplied into the process chamber was set larger than the flow rate of the TCS gas exhausted from the interior of the process chamber, thereby substantially confining the TCS gas in the process chamber.

A SiO film as a sample 2 was formed on a wafer through the use of the substrate processing apparatus of the aforementioned embodiment and according to a film forming sequence in which a step of supplying a precursor and a step of supplying a reactant are alternately implemented. A TCS gas was used as the precursor. An $O_3$ gas was used as the reactant. At the step of supplying the TCS gas, the flow rate of the TCS gas supplied into the process chamber was set to be equal to or smaller than the flow rate of the TCS gas exhausted from the interior of the process chamber, thereby not confining the TCS gas in the process chamber. Other processing procedures and processing conditions were the same as the processing procedures and processing conditions used when producing sample 1.

Figure 13:
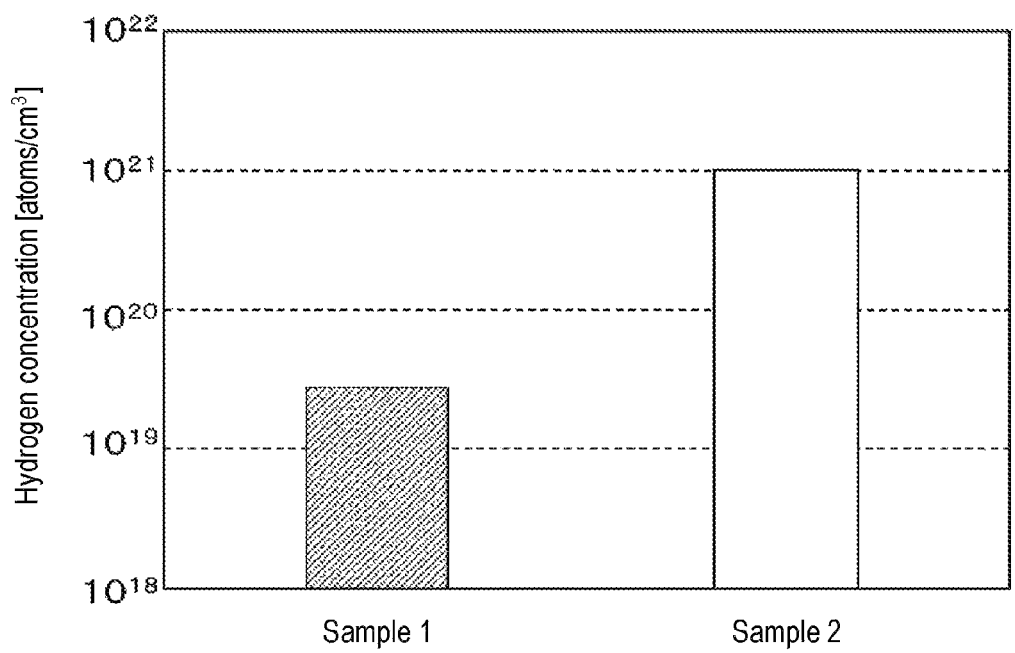
FIG. 13 is a view showing the evaluation results of hydrogen concentrations in SiO films.

After the film forming process is completed, the processed wafer was carried into the air and the SiO film formed on the wafer was exposed to the air. Then, the H concentrations in the SiO films of samples 1 and 2 were respectively measured. FIG. 13 is a view showing the evaluation results of impurity concentrations in the SiO films of samples 1 and 2. The vertical axis in FIG. 13 indicates H concentrations (atoms/cm$^3$) in the films and the horizontal axis sequentially indicates samples 1 and 2.

It can be noted in FIG. 13 that the H concentration in the SiO film of sample 1 is smaller, by one digit or more, than the H concentration in the SiO film of sample 2. That is to say, it can be appreciated that a high-quality SiO film having a low H concentration can be formed by substantially confining the TCS gas in the process chamber at the step of supplying the TCS gas.

According to the present disclosure in some embodiments, it is possible to improve a quality of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film on a substrate by performing a cycle a predetermined number of times, the cycle including non-simultaneously performing:
        forming a first layer by supplying a precursor containing hydrogen and an halogen element to the substrate in a process chamber, under a condition in which the precursor is pyrolyzed if the precursor exists alone and under a condition in which a flow rate of the precursor supplied into the process chamber is larger than a flow rate of the precursor exhausted from an interior of the process chamber; and
        forming a second layer by supplying a reactant to the substrate in the process chamber thereby modifying the first layer.

2. The method of claim 1, wherein in the act of forming the first layer, the halogen element is desorbed by allowing the hydrogen and the halogen element contained in the precursor to react with each other.

3. The method of claim 1, wherein a processing condition in the act of forming the first layer is a condition in which the hydrogen and the halogen element contained in the precursor react with each other and in which the halogen element is desorbed.

4. The method of claim 1, wherein in the act of forming the first layer, the precursor is supplied into the process chamber and confined in the process chamber while closing an exhaust system configured to exhaust the interior of the process chamber.

5. The method of claim 1, wherein in the act of forming the first layer, a processing condition in which the hydrogen and the halogen element contained in the precursor react with each other and in which the halogen element is desorbed, is created by supplying the precursor into the process chamber and confining the precursor in the process chamber while closing an exhaust system configured to exhaust the interior of the process chamber.

6. The method of claim 1, wherein a substance represented by a composition formula, $Si_xH_yCl_z$ (where each of x, y and z is an integer of 1 or more), is used as the precursor.

7. The method of claim 1, wherein at least one substance selected from a group consisting of $SiH_3Cl$, $SiH_2Cl_2$, $SiHCl_3$, $Si_2H_5Cl$, $Si_2H_4Cl_2$, $Si_2H_3Cl_3$, $Si_2H_2Cl_4$, $Si_3H_5Cl$ and $Si_3H_4Cl_2$ is used as the precursor.

8. The method of claim 1, wherein a substance, in which the number of hydrogen atoms contained in one molecule is equal to the number of chlorine atoms contained in one molecule, is used as the precursor.

9. The method of claim 1, wherein in the act of forming the first layer, a hydrogen-free chlorine-containing gas is supplied to the substrate together with the precursor.

10. The method of claim 1, wherein in the act of forming the first layer, a chlorine-free hydrogen-containing gas is supplied to the substrate together with the precursor.

11. The method of claim 1, wherein a hydrogen-free oxygen-containing gas is used as the reactant.

12. The method of claim 1, wherein at least one selected from a group consisting of an $O_3$ gas and a plasma-excited oxygen-containing gas is used as the reactant.

13. The method of claim 1, wherein at least one selected from a group consisting of an $O_3$ gas, a plasma-excited $O_2$ gas, a plasma-excited NO gas, a plasma-excited $N_2O$ gas and a plasma-excited $NO_2$ gas is used as the reactant.

14. The method of claim 1, further comprising:
    after performing the act of forming the film on the substrate, forming a cap layer on the film in a state in which the substrate having the film formed thereon is accommodated in the process chamber without carrying out the substrate from the interior of the process chamber.

15. The method of claim 14, wherein the cap layer is formed by a material differing in etching resistance from the film.

16. The method of claim 14, wherein the cap layer has a thickness of several atomic layers or more and several tens atomic layers or less.

17. A non-transitory computer-readable recording medium storing a program that causes a computer to perform a process of forming a film on a substrate by performing a cycle a predetermined number of times, the cycle including non-simultaneously performing:
    forming a first layer by supplying a precursor containing hydrogen and an halogen element to the substrate in a process chamber, under a condition in which the precursor is pyrolyzed if the precursor exists alone and under a condition in which a flow rate of the precursor supplied into the process chamber is larger than a flow rate of the precursor exhausted from an interior of the process chamber; and
    forming a second layer by supplying a reactant to the substrate in the process chamber thereby modifying the first layer.

* * * * *